US 8,159,313 B2
Apr. 17, 2012

(12) United States Patent
Uchaykin

(10) Patent No.: US 8,159,313 B2
(45) Date of Patent: Apr. 17, 2012

(54) SYSTEMS, METHODS, AND APPARATUS FOR ELECTRICAL FILTERS AND INPUT/OUTPUT SYSTEMS

(75) Inventor: Sergey V. Uchaykin, Burnaby (CA)

(73) Assignee: D-Wave Systems Inc., Burnaby (CA)

( * ) Notice: Subject to any disclaimer, the term of this patent is extended or adjusted under 35 U.S.C. 154(b) by 674 days.

(21) Appl. No.: 12/256,332

(22) Filed: Oct. 22, 2008

(65) Prior Publication Data

US 2009/0102580 A1     Apr. 23, 2009

Related U.S. Application Data

(60) Provisional application No. 60/981,764, filed on Oct. 22, 2007, provisional application No. 60/988,708, filed on Nov. 16, 2007.

(51) Int. Cl.
  *H03H 7/00* (2006.01)
(52) U.S. Cl. .................. 333/185; 333/166; 333/99 S
(58) Field of Classification Search .............. 333/185, 333/166, 99 S; 505/210
  See application file for complete search history.

(56) References Cited

U.S. PATENT DOCUMENTS

| | | | | |
|---|---|---|---|---|
| 4,781,969 A * | 11/1988 | Kobayashi et al. | ........... | 428/209 |
| 5,146,191 A * | 9/1992 | Mandai et al. | ............... | 333/161 |
| 5,616,539 A | 4/1997 | Hey-Shipton et al. | ........ | 505/210 |
| 5,618,777 A | 4/1997 | Hey-Shipton et al. | ........ | 505/210 |
| 5,974,335 A * | 10/1999 | Talisa et al. | ................... | 505/210 |
| 6,026,311 A | 2/2000 | Willemsen Cortés et al. | ............................. | 505/210 |
| 6,424,846 B1 | 7/2002 | Cortés et al. | .................. | 505/210 |
| 6,838,694 B2 | 1/2005 | Esteve et al. | ..................... | 257/34 |
| 7,335,909 B2 | 2/2008 | Amin et al. | ....................... | 257/34 |
| 2003/0087765 A1 | 5/2003 | Cortes et al. | ................... | 505/210 |
| 2005/0104683 A1 | 5/2005 | Cortes et al. | ..................... | 333/99 |
| 2006/0147154 A1 | 7/2006 | Thom et al. | ...................... | 385/37 |
| 2006/0225165 A1 | 10/2006 | Maassen van den Brink et al. | ............................. | 977/933 |
| 2008/0176750 A1 | 7/2008 | Rose et al. | ...................... | 505/170 |
| 2008/0238531 A1 | 10/2008 | Harris | ............................. | 327/528 |
| 2008/0284545 A1* | 11/2008 | Keefe et al. | .................... | 333/204 |

OTHER PUBLICATIONS

U.S. Appl. No. 12/013,192, filed Jan. 11, 2008, Rose et al.
U.S. Appl. No. 12/016,801, filed Jan. 18, 2008, Thom et al.
U.S. Appl. No. 12/017,995, filed Jan. 22, 2008, Harris.
U.S. Appl. No. 12/247,475, filed Oct. 8, 2008, Uchaykin.
U.S. Appl. No. 60/881,358, filed Jan. 18, 2007, Thom et al.
U.S. Appl. No. 60/979,031, filed Oct. 10, 2007, Uchaykin.
U.S. Appl. No. 60/981,764, filed Oct. 22, 2007, Uchaykin.
U.S. Appl. No. 60/986,554, filed Nov. 8, 2007, Choi.
U.S. Appl. No. 60/988,708, filed Nov. 16, 2007, Uchaykin.
U.S. Appl. No. 61/039,710, filed Mar. 26, 2008, Maibaum et al.
U.S. Appl. No. 61/080,996, filed Jul. 15, 2008, Thom et al.

(Continued)

*Primary Examiner* — Robert Pascal
*Assistant Examiner* — Kimberly Glenn
(74) *Attorney, Agent, or Firm* — Seed IP Law Group PLLC

(57) ABSTRACT

An electronic filtering device includes continuous trace on a dielectric substrate and a dissipation layer communicatively coupled to the trace. The dissipation layer may include disconnected metal particles, which may be embedded in a substrate, for example in an epoxy. The continuous trace may be meandering, for example crenulated, coil or spiral signal path. At least a second continuous trace may be spaced from the first by the substrate, and conductively coupled by a via. The electronic filtering device may be used in one or more printed circuit boards (PCBs) that form stages of an input/output system.

17 Claims, 17 Drawing Sheets

OTHER PUBLICATIONS

Blatter et al., "Design aspects of superconducting-phase quantum bits," *Physical Review B 63*: 174511-1-174511-9, 2001.

Friedman et al., "Quantum superposition of distinct macroscopic states," *Nature 406*: 43-46, Jul. 6, 2000.

Il'ichev et al., "Continuous Monitoring of Rabi Oscillations in a Josephson Flux Qubit," *Physical Review Letters 91*(9): 097906-1-097906-4, week ending Aug. 29, 2003.

Makhlin et al., "Quantum-State Engineering with Josephson-Junction Devices," *Reviews of Modern Physics 73*(2): 357-400, Apr. 2001.

Mancini, Ron (ed.), *Op Amps for Everyone*, Texas Instruments, Texas, 2002, Chap. 17, "Circuit Board Layout Techniques," pp. 17-1-17-30.

Milliken, et al., "50 Ω Characteristic Impedance Low-Pass Metal Powder Filters," *Review of Scientific Instruments 78*(024701) 5 pp., 2007.

Mooij et al., "Josephson Persistent-Current Qubit," *Science 285*: 1036-1039, Aug. 13, 1999.

Nielsen et al., *Quantum Computation and Quantum Information*, Cambridge University Press, Cambridge, 2000, "7.8 Other implementation schemes," pp. 343-345.

Orlando et al., "Superconducting Persistent-Current Qubit," *Physical Review B 60*(22): 15 398-15 413, Dec. 1, 1999.

Pobell, Matter and Methods at Low Temperatures, Springer-Verlag, Second Edition, 120-156, 1996.

\* cited by examiner

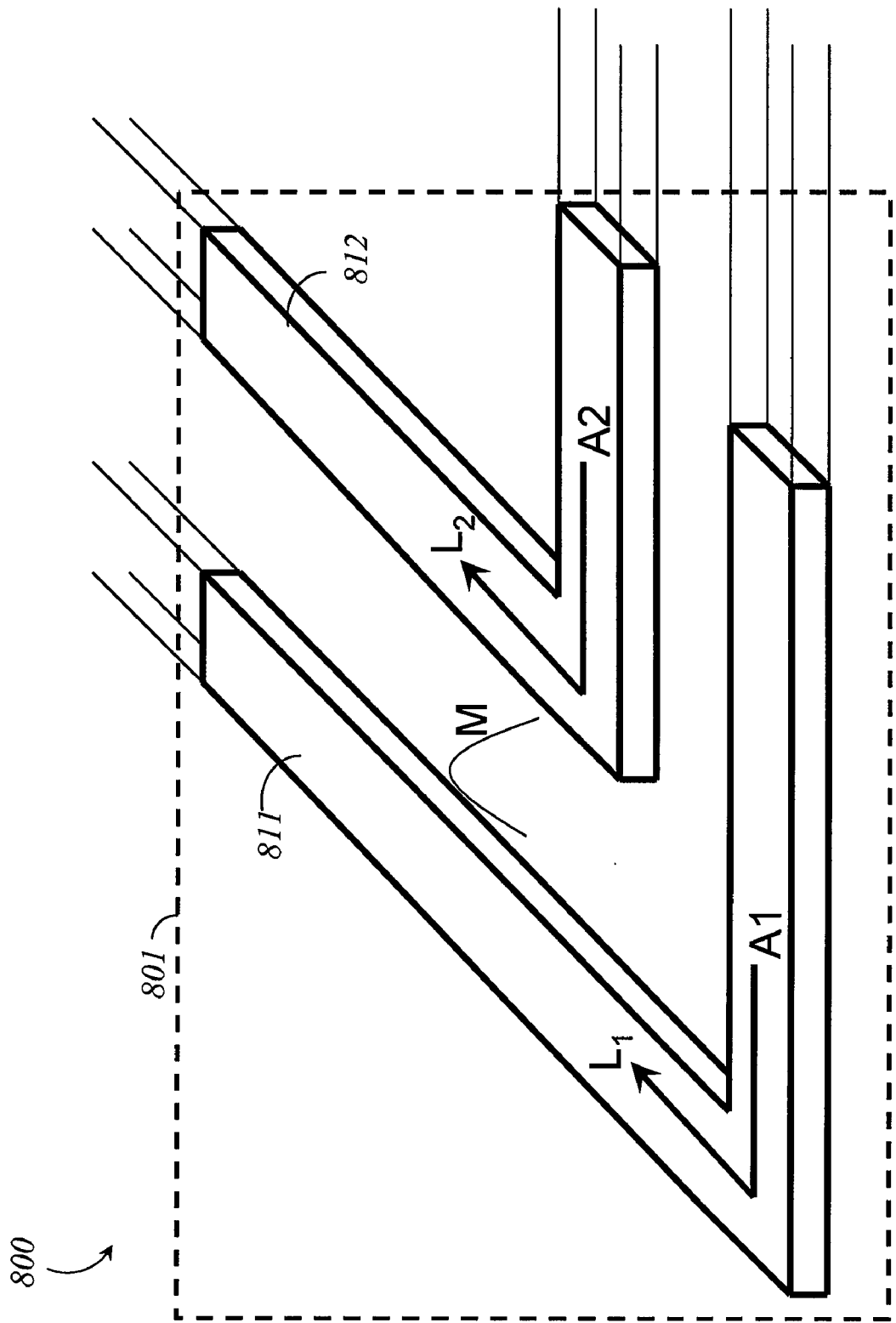

SYSTEMS, METHODS, AND APPARATUS FOR ELECTRICAL FILTERS AND INPUT/OUTPUT SYSTEMS

CROSS REFERENCE TO RELATED APPLICATIONS

This application claims benefit under 35 U.S.C. 119(e) of U.S. Provisional Patent Application Ser. No. 60/981,764, filed Oct. 22, 2007, entitled "Systems, Methods, and Apparatus For Electronic Filters" and U.S. Provisional Patent Application Ser. No. 60/988,708, filed Nov. 16, 2007, entitled "Modular Input/Output System and Devices Incorporating Printed Circuit Board Components", which are incorporated herein by reference in their entirety.

BACKGROUND

Field

The present systems, methods, and apparatus generally relate to the filtering of electronic signals and particularly relate to modular PCB-based input/output (I/O) systems and devices for use with such I/O systems.

Electrical Signal Filtering

During transmission, an electrical signal typically comprises a plurality of components each transmitting at a different frequency. The "filtering" of an electrical signal typically involves the selective removal of certain frequencies from the electrical signal during transmission. Such filtering may be accomplished "passively" or "actively". A passive electrical filter is one that operates without additional power input; that is, the filtering is accomplished by the natural characteristics of the materials or devices through which the electrical signal is transmitted. Many such passive filters are known in the art, including filters that implement lumped elements such as inductors and capacitors, collectively referred to as lumped element filters (LEFs).

Simple, passive lumped element filters include low-pass and high-pass filters. A low-pass filter is one that filters out higher frequencies and allows lower frequencies to pass through. Conversely, a high-pass filter is one that filters out lower frequencies and allows higher frequencies to pass through. The concepts of low-pass and high-pass filters may be combined to produce "band-pass" filters, which effectively transmit a given range of frequencies and filter out frequencies that fall outside (above or below) of that range. Similarly, "band-stop" filters may be implemented which effectively transmit most frequencies and filter out frequencies that fall inside a given range.

Refrigeration

Throughout this specification and the appended claims, various embodiments of the present systems, methods and apparatus are described as being "superconducting" or incorporating devices referred to as "superconductors." According to the present state of the art, a superconducting material may generally only act as a superconductor if it is cooled below a critical temperature that is characteristic of the specific material in question. For this reason, those of skill in the art will appreciate that a system that implements superconducting components may implicitly include a refrigeration system for cooling the superconducting components. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems, methods and apparatus are not limited to applications involving dilution refrigerators, but rather may be applied using any type of refrigeration system. Furthermore, those of skill in the art will appreciate that, throughout this specification and the appended claims, the term "superconducting" is used to describe a material that is capable of acting as a superconductor and may not necessarily be acting as a superconductor at all times in all embodiments of the present systems, methods and apparatus.

Superconducting Qubits

There are many different hardware and software approaches under consideration for use in quantum computers. One hardware approach uses integrated circuits formed of superconducting materials, such as aluminum or niobium. The technologies and processes involved in designing and fabricating superconducting integrated circuits are similar in some respects to those used for conventional integrated circuits.

Superconducting qubits are a type of superconducting device that can be included in a superconducting integrated circuit. Superconducting qubits can be separated into several categories depending on the physical property used to encode information. For example, they may be separated into charge, flux and phase devices, as discussed in, for example Makhlin et al., 2001, *Reviews of Modern Physics* 73, pp. 357-400. Charge devices store and manipulate information in the charge states of the device, where elementary charges consist of pairs of electrons called Cooper pairs. A Cooper pair has a charge of 2e and consists of two electrons bound together by, for example, a phonon interaction. See e.g., Nielsen and Chuang, *Quantum Computation and Quantum Information*, Cambridge University Press, Cambridge (2000), pp. 343-345. Flux devices store information in a variable related to the magnetic flux through some part of the device. Phase devices store information in a variable related to the difference in superconducting phase between two regions of the phase device. Recently, hybrid devices using two or more of charge, flux and phase degrees of freedom have been developed. See e.g., U.S. Pat. No. 6,838,694 and U.S. Pat. No. 7,335,909.

Examples of flux qubits that may be used include rf-SQUIDs, which include a superconducting loop interrupted by one Josephson junction, or a compound junction (where a single Josephson junction is replaced by two parallel Josephson junctions), or persistent current qubits, which include a superconducting loop interrupted by three Josephson junctions, and the like. See e.g., Mooij et al., 1999, *Science* 285, 1036; and Orlando et al., 1999, *Phys. Rev. B* 60, 15398. Other examples of superconducting qubits can be found, for example, in II'ichev et al., 2003, *Phys. Rev. Lett.* 91, 097906; Blatter et al., 2001, *Phys. Rev. B* 63, 174511, and Friedman et al., 2000, *Nature* 406, 43. In addition, hybrid charge-phase qubits may also be used.

The qubits may include a corresponding local bias device. The local bias devices may include a metal loop in proximity to a superconducting qubit that provides an external flux bias to the qubit. The local bias device may also include a plurality of Josephson junctions. Each superconducting qubit in the quantum processor may have a corresponding local bias device or there may be fewer local bias devices than qubits. In some embodiments, charge-based readout and local bias devices may be used. The readout device(s) may include a plurality of dc-SQUID magnetometers, each inductively connected to a different qubit within a topology. The readout device may provide a voltage or current. The dc-SQUID magnetometers including a loop of superconducting material interrupted by at least one Josephson junction are well known in the art.

Quantum Processor

A computer processor may take the form of an analog processor, for instance a quantum processor such as a superconducting quantum processor. A superconducting quantum processor may include a number of qubits and associated local bias devices, for instance two or more superconducting qubits. Further detail and embodiments of exemplary quantum processors that may be used in conjunction with the present systems, methods, and apparatus are described in US Patent Publication No. 2006-0225165, U.S. patent application Ser. No. 12/013,192, U.S. Provisional Patent Application Ser. No. 60/986,554 filed Nov. 8, 2007 and entitled "Systems, Devices and Methods for Analog Processing," and U.S. Provisional Patent Application Ser. No. 61/039,710, filed Mar. 26, 2008 and entitled "Systems, Devices, And Methods For Analog Processing."

A superconducting quantum processor may include a number of coupling devices operable to selectively couple respective pairs of qubits. Examples of superconducting coupling devices include rf-SQUIDs and dc-SQUIDs, which couple qubits together by flux. SQUIDs include a superconducting loop interrupted by one Josephson junction (an rf-SQUID) or two Josephson junctions (a dc-SQUID). The coupling devices may be capable of both ferromagnetic and anti-ferromagnetic coupling, depending on how the coupling device is being utilized within the interconnected topology. In the case of flux coupling, ferromagnetic coupling implies that parallel fluxes are energetically favorable and anti-ferromagnetic coupling implies that anti-parallel fluxes are energetically favorable. Alternatively, charge-based coupling devices may also be used. Other coupling devices can be found, for example, in US Patent Publication No. 2006-0147154 and U.S. patent application Ser. No. 12/017,995. Respective coupling strengths of the coupling devices may be tuned between zero and a maximum value, for example, to provide ferromagnetic or anti-ferromagnetic coupling between qubits.

A superconducting quantum processor may further include one or more readout devices. Examples of readout devices include dc-SQUIDs. Each superconducting qubit in a quantum processor may have a corresponding readout device or alternatively, there may be fewer readout devices than qubits.

When operating highly sensitive electronics such as superconducting qubits, coupling devices and/or readout devices, it is highly desirable to eliminate or at least reduce any noise which would otherwise adversely affect the operation of such electronics. For example, it is highly desirable to eliminate or reduce noise when operating an analog processor, for instance a quantum processor that includes a number of qubits and coupling devices.

Maintaining superconducting temperatures may be difficult since many materials that are capable of superconducting do not provide good thermally conductive paths. Such may be particularly difficult with I/O systems since such I/O systems interface with non-refrigerated environments.

Superconducting Processor

A computer processor may take the form of a superconducting processor, where the superconducting processor may not be a quantum processor in the traditional sense. For instance, some embodiments of a superconducting processor may not focus on quantum effects such as quantum tunneling, superposition, and entanglement but may rather operate by emphasizing different principles, such as for example the principles that govern the operation of classical computer processors. However, there may still be certain advantages to the implementation of such superconducting processors. Due to their natural physical properties, superconducting processors in general may be capable of higher switching speeds and shorter computation times than non-superconducting processors, and therefore it may be more practical to solve certain problems on superconducting processors.

BRIEF SUMMARY

At least one embodiment may be summarized as an electrical signal filtering device including a dielectric substrate; a first continuous conductive trace carried by the dielectric substrate layer that forms a first circuitous route for connecting two points on the dielectric substrate; and a first dissipation layer that includes a dissipative metal, wherein at least a portion of the dissipative metal is communicatively coupled to at least a portion of the first continuous conductive trace on the dielectric substrate.

The dissipative metal in the first dissipation layer may be coupled to ground. The first dissipation layer may include a plurality of disconnected metal particles. The disconnected metal particles may be embedded in at least a portion of the dielectric substrate. The disconnected metal particles may be embedded in at least a portion of an epoxy substance and at least a portion of the epoxy substance may be in contact with at least a portion of the dielectric substrate. The communicative coupling between at least a portion of the dissipative metal in the dissipation layer and at least a portion of the first continuous conductive trace on the dielectric substrate may include at least one of capacitive, inductive, and galvanic coupling. The first circuitous route may be a meandering signal path that connects a first point near a first end of the dielectric substrate to a second point near an opposite end along a length of the dielectric substrate by a plurality of changes in direction across a width of the dielectric substrate. The first circuitous route may be at least one of a coil and a spiral signal path that connects a first point near a perimeter of the dielectric substrate to a second point near a center of the dielectric substrate by concentric turns inwards from the perimeter towards the center of the dielectric substrate.

The filtering device may further include a second continuous conductive trace that establishes a circuitous route for connecting two points, the second continuous conductive trace spaced from the first continuous conductive trace by at least the dielectric substrate. At least a portion of the second continuous conductive trace may be coupled to at least a portion of the dissipative metal on the first dissipative layer.

The filtering device may further include a second dissipative layer that may include a dissipative metal communicatively coupled to at least a portion of the second continuous conductive trace. The first continuous conductive trace may be galvanically coupled to the second continuous conductive trace by a via connection extending through at least a portion of the dielectric substrate. The second circuitous route may be a meandering signal path that connects a first point near the first end of the dielectric substrate to a second point near the opposite end along the length of the dielectric substrate by a plurality of changes in direction across the width of the dielectric substrate. The second circuitous route may be at least one of a coil signal path and a spiral signal path that connects a first point near the perimeter of the dielectric substrate to a second point near a center of the dielectric substrate by concentric turns inwards from the perimeter towards the center of the dielectric substrate.

The filtering device may further include a first shielding layer which may include an approximately uniform metal plane.

The filtering device may further include a second shielding layer which may include an approximately uniform metal plane. The first and the second continuous conductive traces may be situated in between the first and the second shielding layers, and may include a number of edges of the dielectric substrate which may be plated with shielding metal such that the first and the second continuous conductive traces may be completely enclosed by the shielding metal of the first and the second shielding layers and the edges.

At least one embodiment may be summarized as an input/output (I/O) system including a first communicative component; a second communicative component, wherein at least one of the first and the second communicative components includes a device that is superconducting below a critical temperature; and a communicative connection that communicatively couples the first and the second communicative components, the communicative connection including a plurality of printed circuit board (PCB) stages including a first stage and at least one additional stage communicatively coupled in series with the first stage between the first and the second communicative components, at least one of the first stage and the at least one additional stage including a continuous circuitous conductive trace carried by at least one printed circuit board (PCB) and a dissipative metal communicatively coupled to the continuous circuitous conductive trace to at least partially dissipate energy carried thereby.

The at least one PCB may be a rigid PCB. The at least one PCB may be a flexible PCB. The at least one additional stage may be communicatively coupled directly to the second communicative component without any intervening stages therebetween. The PCB may be a laminate structure. The first stage and the at least one additional stage may include respective portions of the PCB and the first stage and the at least one additional stage may be galvanically coupled to one another. The first stage and the at least one additional stage may each include portions of respective PCBs. The I/O system may further include at least one connector that physically couples the respective PCBs and provides communications between the first stage and the at least one additional stage. The at least one additional stage may include a second stage and a third stage, the second stage communicatively coupled in series in between the first stage and the third stage, and wherein the third stage may be formed by at least one conductive trace on at least one PCB. At least a portion of the continuous circuitous conductive trace may include at least one of a meandering signal path, a coiling signal path, and a spiraling signal path. The at least one PCB may include multiple conductive traces, where each of at least two of the conductive traces on the PCB may be a distinct signal channel. At least a portion of at least one PCB may include multiple insulative layers. The superconducting device may be a superconducting computer processor. The superconducting computer processor may be a superconducting quantum processor.

At least one embodiment may be summarized as an I/O assembly to communicatively couple a first communicative component and a second communicative component, the I/O assembly including a plurality of communicative connections between the first and the second communicative component, the majority of each communicative connection being formed by at least one respective conductive trace on at least one respective printed circuit board (PCB) substrate, wherein at least a portion of each communicative connection is superconducting below a critical temperature.

At least one of the plurality of communicative connections may be configured to passively filter a signal. The conductive trace of the at least one of the plurality of communicative connections configured to passively filter a signal may be a circuitous conductive trace. The at least one of the plurality of communicative connections configured to passively filter a signal may include a dissipative metal communicatively coupled to the circuitous conductive trace to at least partially dissipate a signal carried thereby. The dissipative metal may include a plurality of non-continuous metal elements. The circuitous conductive trace may be a meandering trace. The circuitous conductive trace may be a coil trace. The circuitous conductive trace may be a spiral trace. At least two conductive traces may be formed on a single one of the at least one PCB substrate.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 8 is an isometric view of a portion of an embodiment of a coil filter.

Figure 13:
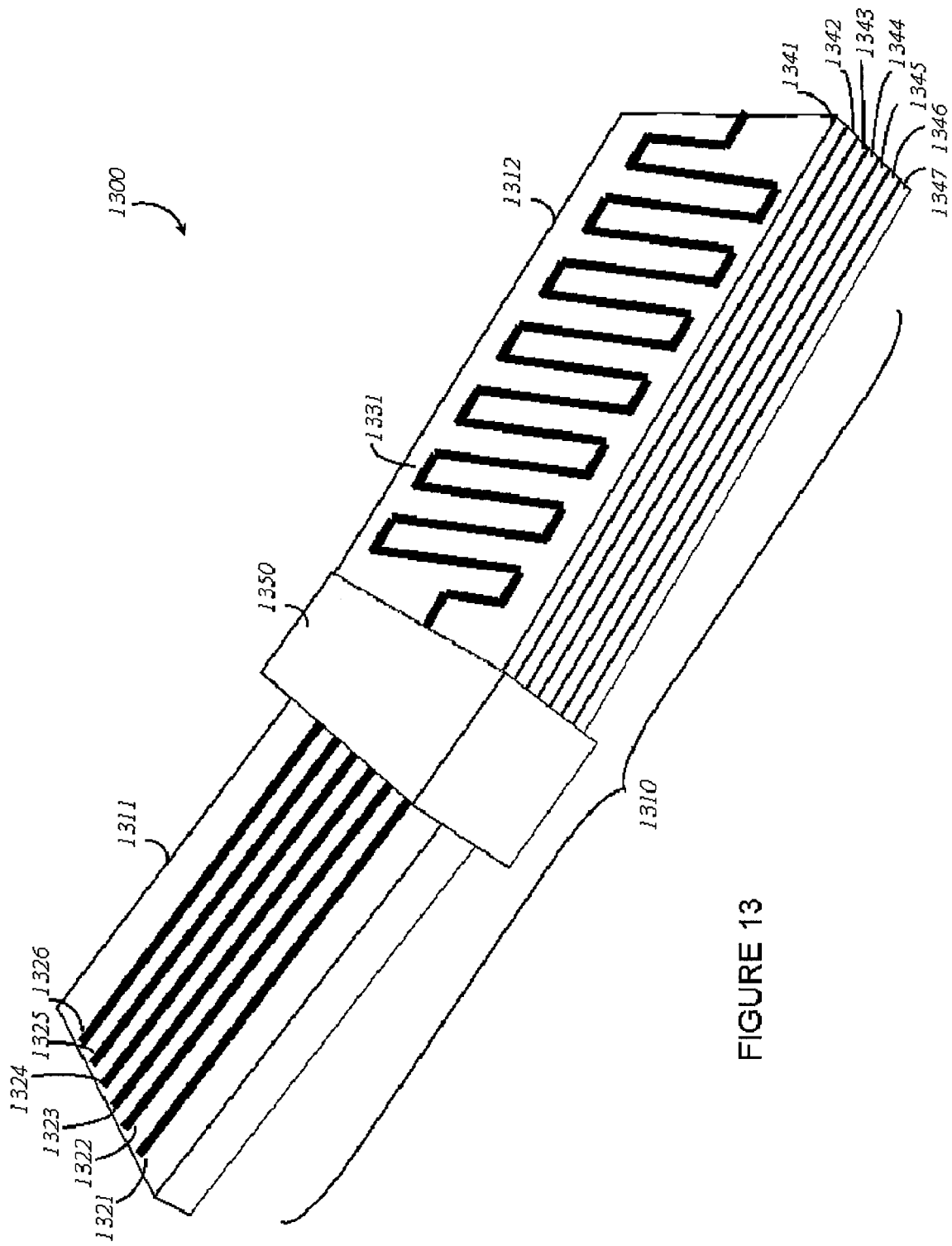

FIG. 13 an isometric view of an embodiment of an I/O system with a communicative connection that includes a single-layer flexible PCB and a multilayer flexible PCB.

Figure 14:
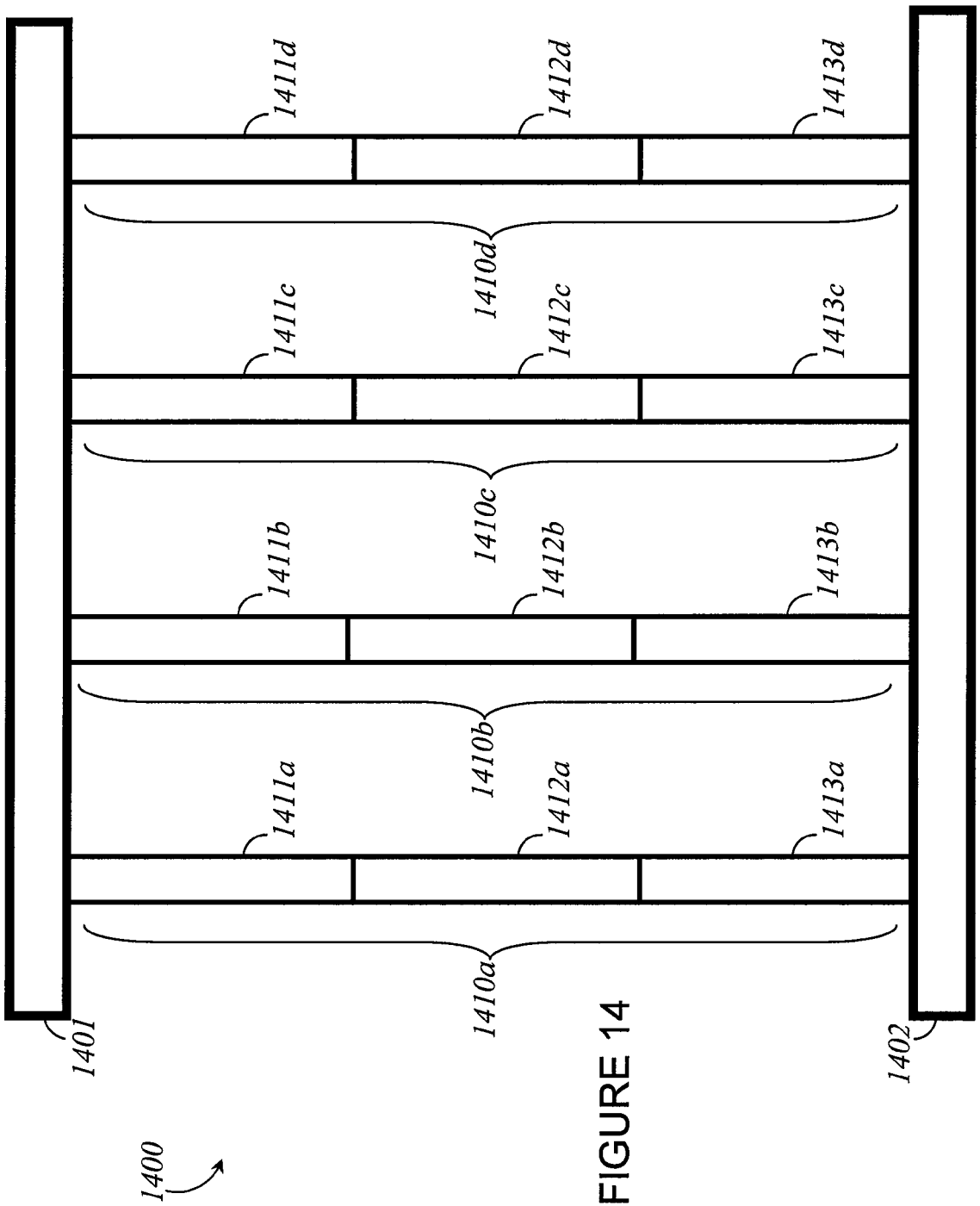

FIG. 14 is a schematic diagram of an embodiment of an I/O system that includes a plurality of communicative connections.

Figure 15:
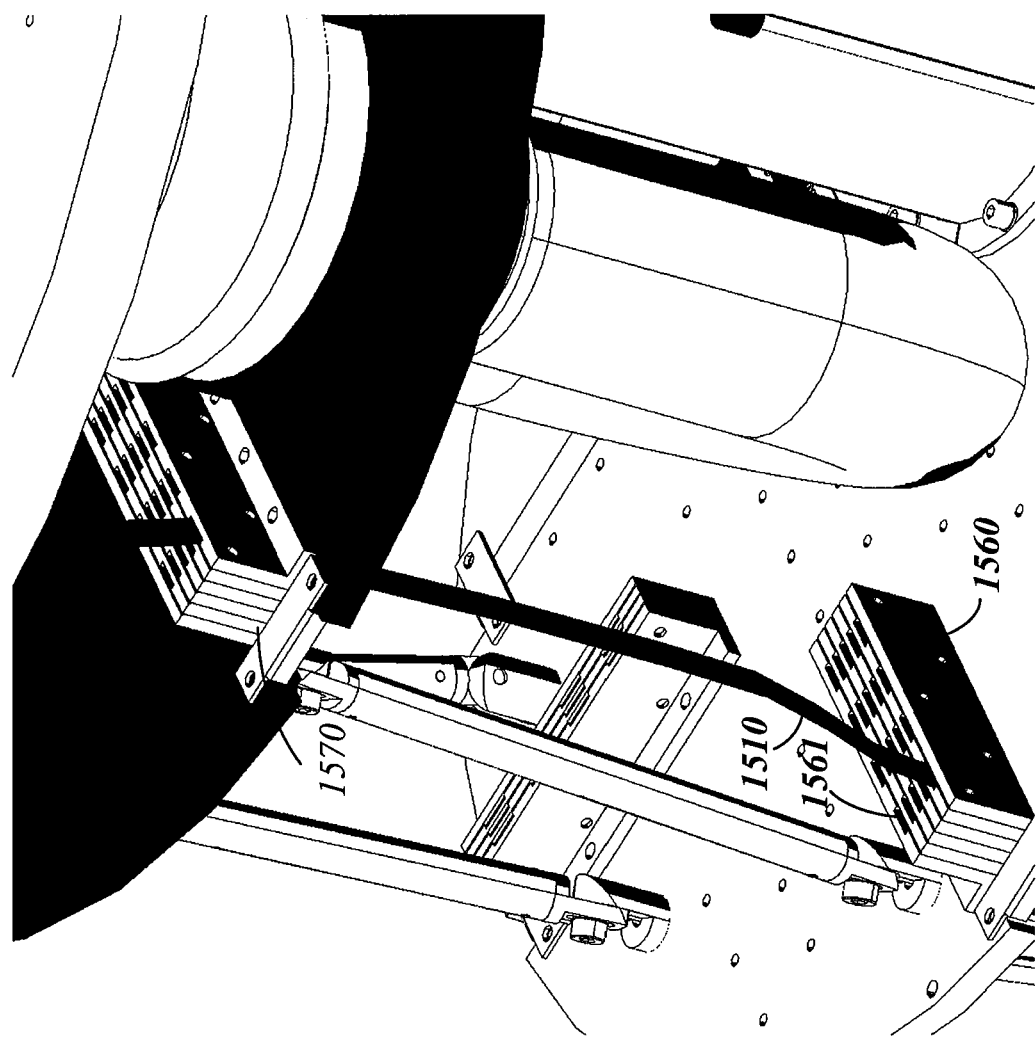

FIG. 15 is an isometric view of a portion of an I/O system showing a communicative connection in thermal contact with a refrigeration component through a clamp.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electrical filters and/or printed-circuit boards have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

The headings and Abstract of the Disclosure provided herein are for convenience only and do not interpret the scope or meaning of the embodiments.

The present systems, methods and apparatus describe novel techniques for the filtering of electrical signals. Specifically, the techniques described herein implement passive electrical filters based on printed-circuit boards (PCBs). Many different devices exist for the purpose of passive electrical signal filtering. These devices include filters that implement lumped elements such as inductors and capacitors (lumped element filters, or LEFs) and metal powder filters (MPFs). Such devices are highly adaptable and may typically be adapted to provide the desired performance and range of frequency response for most applications. However, as the performance requirements become more demanding, the manufacture or assembly of many of these existing filter devices can become complicated and labor-intensive. Thus, there is a need in the art for passive electrical signal filtering devices that may be readily manufactured or assembled while still providing the desired performance and range of frequency response for a wide variety of applications.

The various embodiments of electrical filters described herein may be used for low-pass, high-pass, band-pass, and band-stop applications. Throughout the remainder of this specification, specific structures relating to passive low-pass filters are described; however, those of skill in the art will appreciate that the concepts taught herein may be adapted to meet other filtering requirements, such as high-pass, band-pass, and band-stop filtering.

Figure 1A:
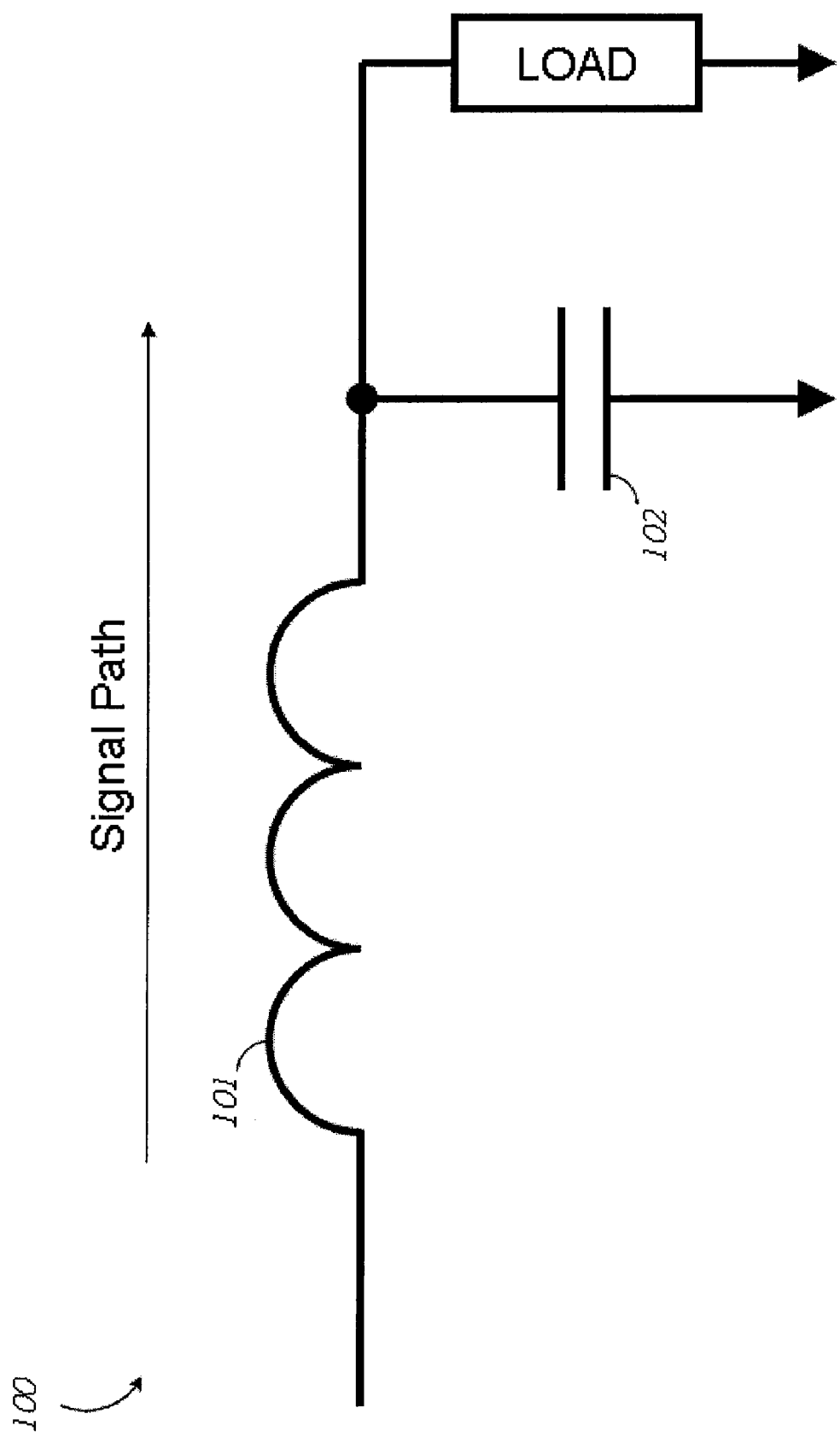
FIG. 1A is a schematic diagram of a typical passive low-pass lumped element filter.

FIG. 1A is a schematic diagram of a typical passive low-pass lumped element filter (LEF) 100. LEF 100 includes an inductor 101 that is coupled within the signal path (i.e., in series with the load) and a capacitor 102 that couples the signal path to ground (i.e., in parallel with the load). An inductor's impedance naturally increases as the frequency of the signal passing through it increases. This means that inductor 101 allows low-frequency signals to pass through but naturally blocks high-frequency signals from propagating along the signal path. Conversely, a capacitor's impedance naturally decreases as the frequency of the signal passing through it increases. This means that capacitor 102 couples high-frequency signals directly to ground and naturally forces low-frequency signals to propagate along the signal path. Thus, LEF 100 has two mechanisms by which high-frequency signals are filtered out of the electrical signal: inductor 101 blocks the flow of some high-frequency signals but permits low-frequency signals to pass through, and capacitor 102 provides a short to ground for some high-frequency signals but forces low-frequency signals to carry-on along the signal path towards the load.

Figure 1B:
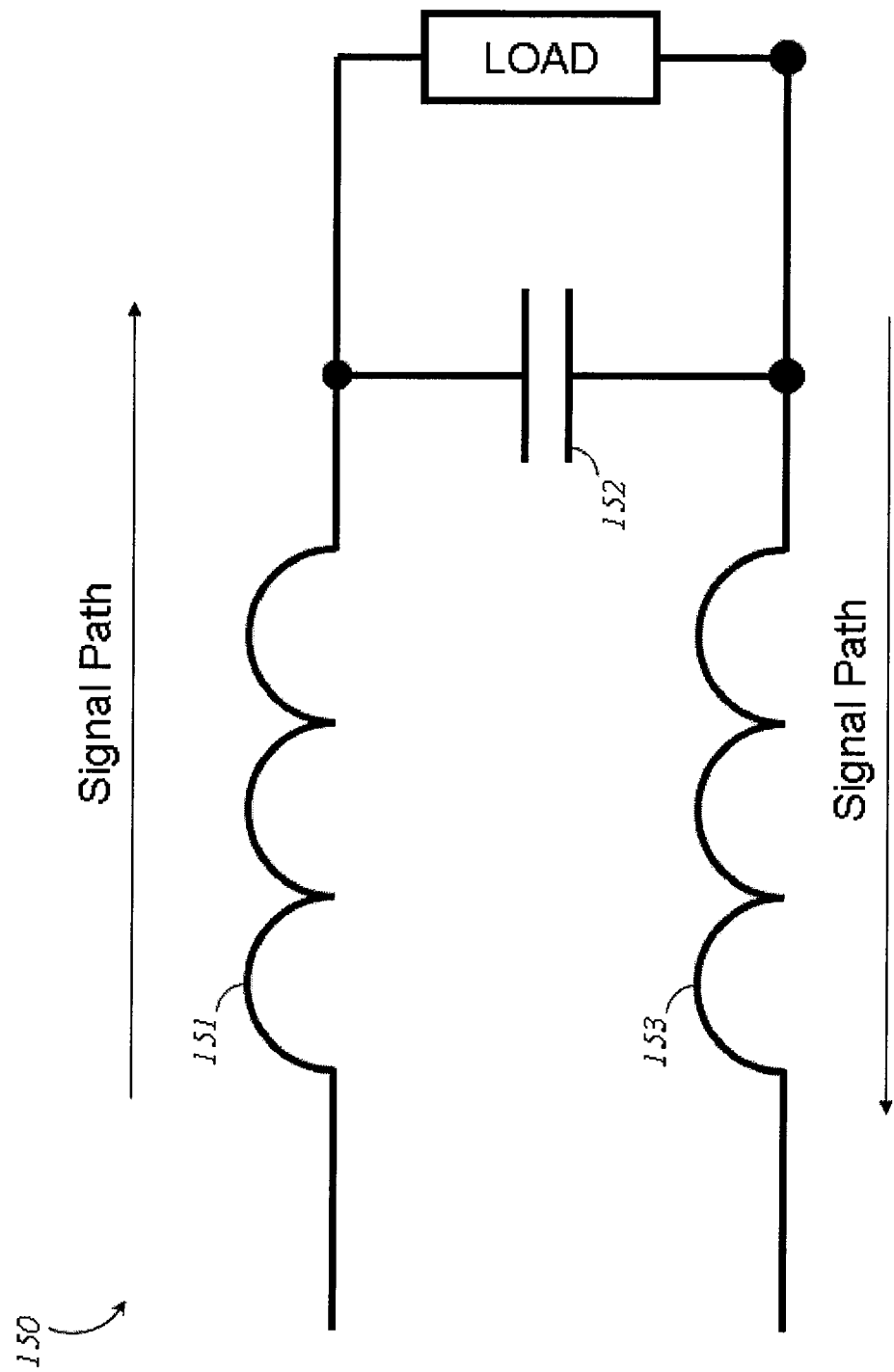
FIG. 1B is a schematic diagram of a typical passive differential low-pass lumped element filter.

A modified version of the simple low-pass filter shown in FIG. 1A is the differential filter. FIG. 1B is a schematic diagram of a typical passive differential low-pass lumped element filter (LEF) 150. LEF 150 functions in a similar way to LEF 100, exceptive that capacitive couplings, such as through capacitor 152, are made to a second inductive signal path as opposed to ground. The benefits and drawbacks of differential LEF 150 are known in the art. The purpose of FIG. 1B is to illustrate that a differential low-pass filter may be modeled by the circuit of LEF 150.

Throughout this specification and the appended claims, the term "signal path" is used to describe a conductive conduit through or upon which an electrical signal may be propagated. In the illustrated embodiments, such paths are realized by conductive traces on PCBs. However, as previously described a typical electrical signal may comprise multiple signal frequencies and, during filtering, various frequencies may follow different signal paths. An electrical filter may be designed such that the signal frequency of interest propagates through the filter while all undesirable frequencies are filtered out. Thus, the term "signal path" is used herein to describe the route traveled by the particular electrical signal for which filtering is desired as it passes through an electrical filter.

Figure 2:
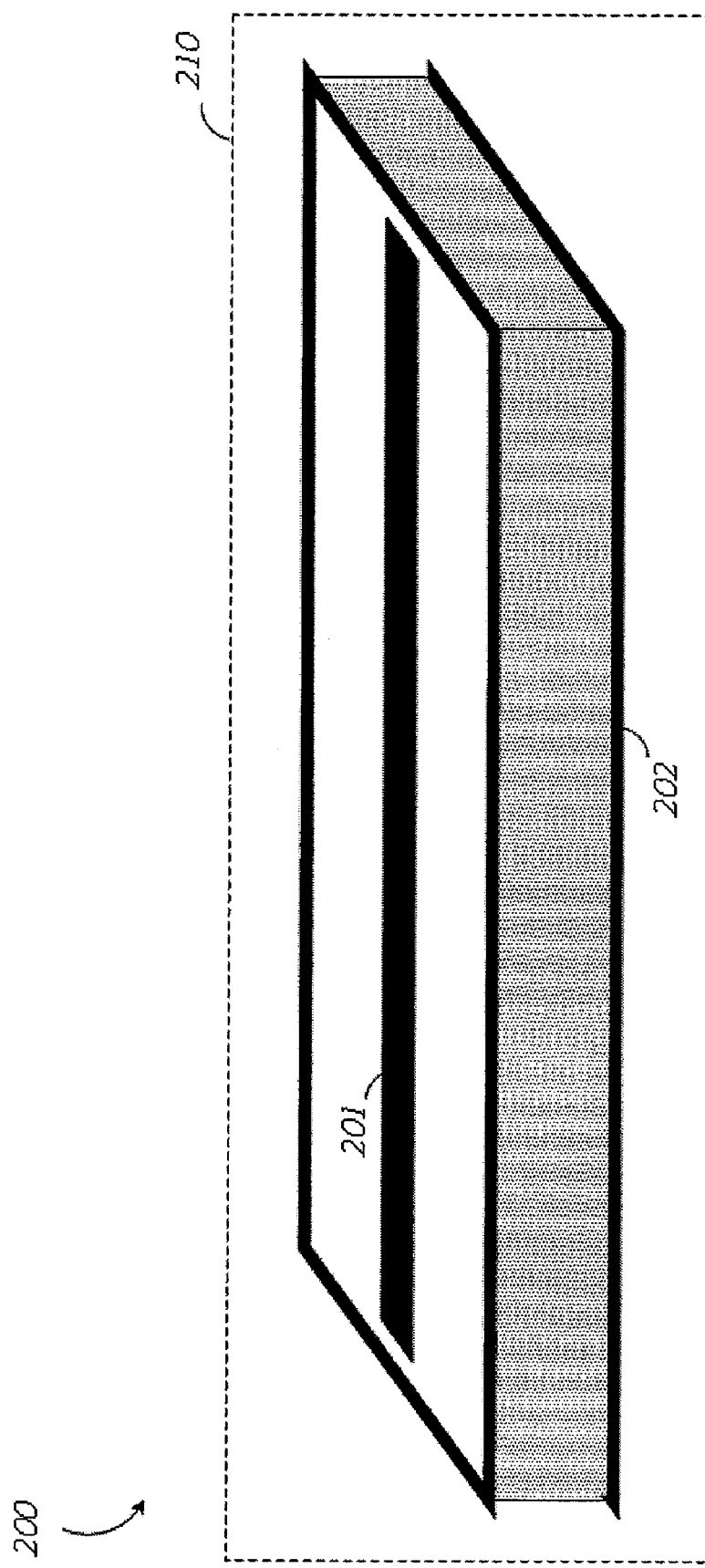
FIG. 2 is a schematic diagram of an embodiment of a passive low-pass filter that comprises a conductive signal path on a printed circuit board.

The present systems, methods and apparatus provide alternative devices for realizing the filtering mechanisms illustrated in FIG. 1A and FIG. 1B. Any given transmission path, such as a conductive wire, has an inherent inductance and capacitance per unit length. In the present systems, methods and apparatus, these inherent characteristics may be used for the purposes of electrical signal filtering. In a simple embodiment, a first conductive trace on a PCB is used as a signal path and a second conductive trace on the same PCB is used as the ground. FIG. 2 is a schematic diagram of an embodiment of a passive low-pass filter 200 that comprises conductive paths 201 and 202 on a PCB 210. Conductive path 201 is situated on a first layer of PCB 210 and conductive path 202 is situated on a second layer of PCB 210. In filter 200, path 201 is a conductive trace on a first layer of PCB 210 and path 202 is ground plane on a second layer of PCB 210. Each of paths 201 and 202 may be made, for example, of normal metal, or superconducting metal, or normal metal that is plated with superconducting metal. The mechanisms by which filter 200 may function as a passive low-pass filter are similar to those described for LEF 100 in FIG. 1A. As described above, path 201 has an inherent inductance per unit length, thus path 201 may be modeled as an inductor such as inductor 101 in LEF 100. Furthermore, the positioning of path 201 in sufficiently close proximity to path 202 may provide a capacitive coupling between paths 201 and 202. This coupling may be increased by broadening the trace-width of path 201 and reducing the thickness of the dielectric medium (represented by grey dots in PCB 210) that separates paths 201 and 202. Thus, filter 200 has an inductance that is coupled in series with the signal path (path 201) and a capacitive coupling to ground (path 202). Filter 200 effectively realizes the circuit of LEF 100 illustrated in FIG. 1A. The inductance of path 201 naturally impedes the transmission of high frequency signals, and the capacitive coupling between paths 201 and 202 provides a short to ground that is not accessible by low frequency signals.

Throughout this specification and the appended claims, various embodiments are described as being implemented on or with printed-circuit boards (PCBs). Those of skill in the art will appreciate that the principles and concepts taught herein may also be implemented using other forms of conductive current paths. Furthermore, the term "printed-circuit board" is not limited to rigid printed circuit boards or non-superconducting printed circuit boards, but also includes flexible printed circuit board technology and superconducting printed circuit board technology.

In some embodiments of filter 200, path 202 provides a dissipative metal layer that generates eddy currents in response to the electrical transmission through path 201 and thereby helps to dissipate unwanted frequencies in path 201. In some embodiments of filter 200, path 201 may comprise at least two layers of conductive metal, where one conductive metal has a lowest resistance and provides the path through which the electrical signal flows. The additional conductive layers that comprise path 201 may serve as dissipative layers that help to dissipate unwanted frequencies in path 201. A specific realization of this embodiment is the case where path 201 is formed by a superconducting metal that is plated upon a non-superconducting metal in accordance with superconducting PCB fabrication processes. Alternatively, in some embodiments a superconducting trace, such as a niobium trace, may be laid directly upon a PCB rather than plating a non-superconducting metal. In such embodiments, a dissipative layer may be realized by plating the superconducting trace with, for example, a non-superconducting metal.

While filter 200 may provide sufficient filtering performance for certain applications, it may be desirable to increase its filtering ability. As discussed above, path 201 may be modeled as an inductor, such as inductor 101 in FIG. 1A, because path 201 has an inherent inductance per unit length. It follows that the inductance of path 201 may be increased by increasing the length of path 201. However, to achieve a sufficiently high inductance for some applications, this may require a particularly long conductive path and it simply may not be feasible to incorporate overly long conductive paths into certain systems. Thus, the present systems, methods and apparatus describe further embodiments of passive PCB-based filter devices that are more space-efficient than the embodiment of filter 200 illustrated in FIG. 2.

Figure 3:
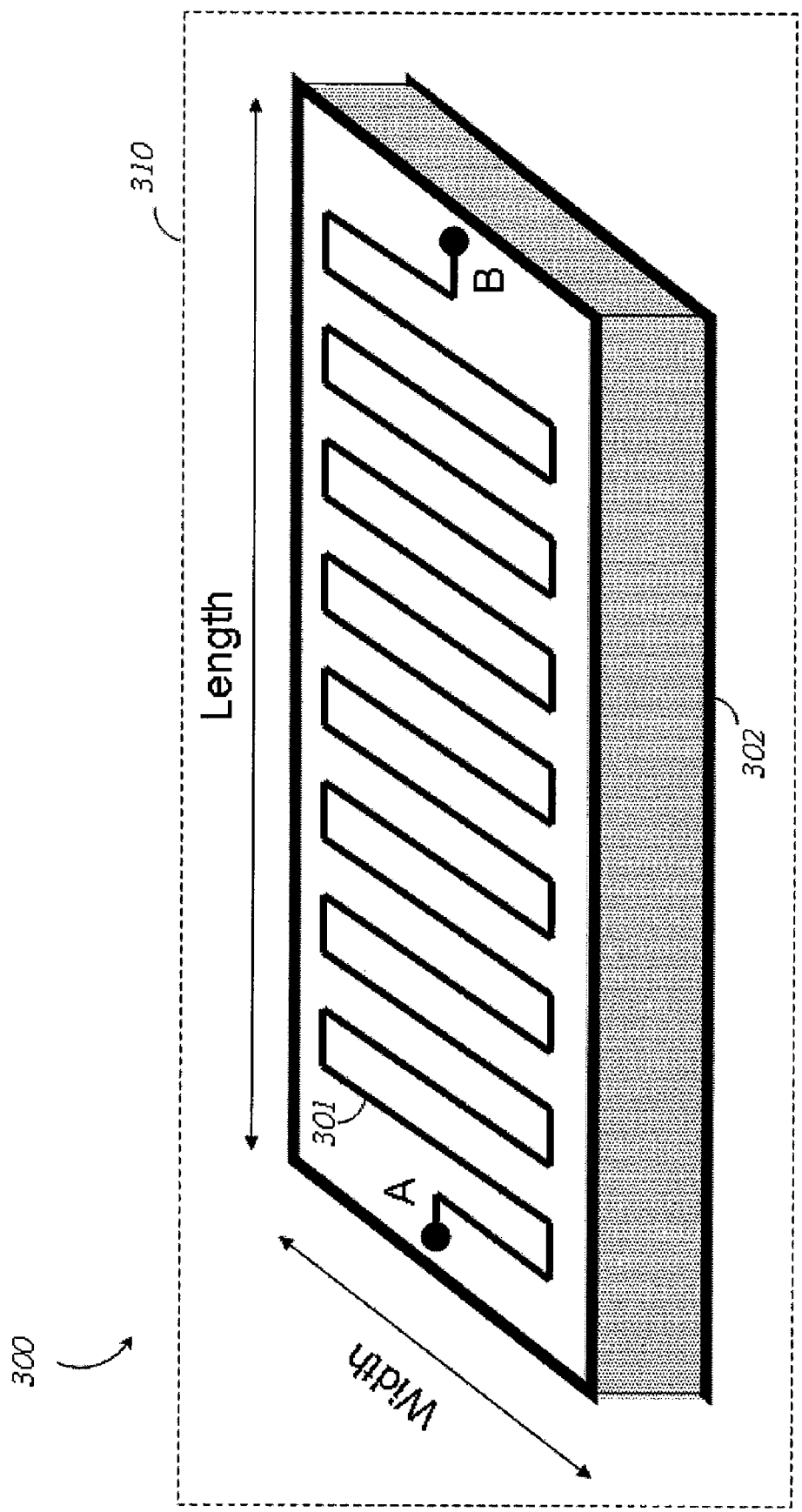
FIG. 3 is a schematic diagram of an embodiment of a passive low-pass filter that comprises a meandering signal path on a first layer of a printed circuit board.

FIG. 3 is a schematic diagram of an embodiment of a passive low-pass filter 300 that comprises a meandering signal path 301 on a first layer of a PCB 310. Meander signal path 301 may be a conductive path similar to path 201 from FIG. 2; however, meander signal path 301 is designed to follow a "crenellated" or "serpentine" path back-and-forth across a portion (e.g., the width as indicated in FIG. 3) of PCB 310 leading from a first point A to a second point B along the length (as indicated in FIG. 3) of PCB 310. In this specification and the appended claims, the terms "length" and "width" when used to describe dimensions of a PCB are used to refer to the longer and shorter dimensions, respectively (as drawn in FIG. 3). While a similar crenellated path could be implemented that traces back-and-forth along the length of PCB 310 leading from point A to point B, or even at an acute or obtuse angle with respect thereto, in most embodiments it is advantageous to orient the meander signal path 301 across the width as illustrated.

In some embodiments, a meandering signal path may be realized using two layers of a PCB with alternating segments of conductive traces on both layers being coupled together through vias. In such embodiments, the electrical signal path may be made to "meander" back and forth between the two layers of the PCB. That is, the signal path may begin with a first conductive trace segment on a first layer of the PCB, pass through a via and couple to a first conductive trace segment on a second layer of the PCB, pass through a via and couple to a second conductive trace segment on the first layer of the PCB, pass through a via and couple to a second conductive trace segment on the second layer of the PCB, and so on.

Using a conductive path similar to the meander signal path 301 can be advantageous over the straight path 201 shown in FIG. 2, because the meander signal path 301 greatly increases the length of the signal path without necessitating an increase in the size of PCB 310. Filter 300 functions in much the same way as filter 200 by providing an inductance in the signal path and a capacitive coupling to ground 302. However, for any given size of PCB, meander signal path 301 may produce a larger inductance and a larger capacitance than path 201. Similar to filter 200, in filter 300 ground 302 may serve as a dissipative metal layer for attenuating unwanted signal frequencies. In various embodiments, additional or alternative dissipative metal layers may also be incorporated into filter 300 in similar ways to those described for filter 200. A specific realization of this embodiment is the case where the meander signal path 301 is formed by a superconducting metal that is plated upon a non-superconducting metal in accordance with superconducting PCB fabrication processes.

The embodiment of a meander-based PCB filter shown in FIG. 3 is intended for illustrative purposes only and does not limit the present systems, methods and apparatus to the exact layout scheme shown. For instance, those of skill in the art will appreciate that the right-angled crenellations used in the illustrated meandering signal path 301 may be substituted with rounded arcs, triangular points, or any other means of re-directing a conductive trace. Furthermore, as previously indicated the drawings may not be to scale. In some embodiments, it can be advantageous to ensure that the width of meander signal path 301 is appreciatively larger than the gap between the meander signal path 301 and ground 302. Such a relationship may be used to produce the desired amount of capacitance between meander signal path 301 and ground 302.

Figure 4:
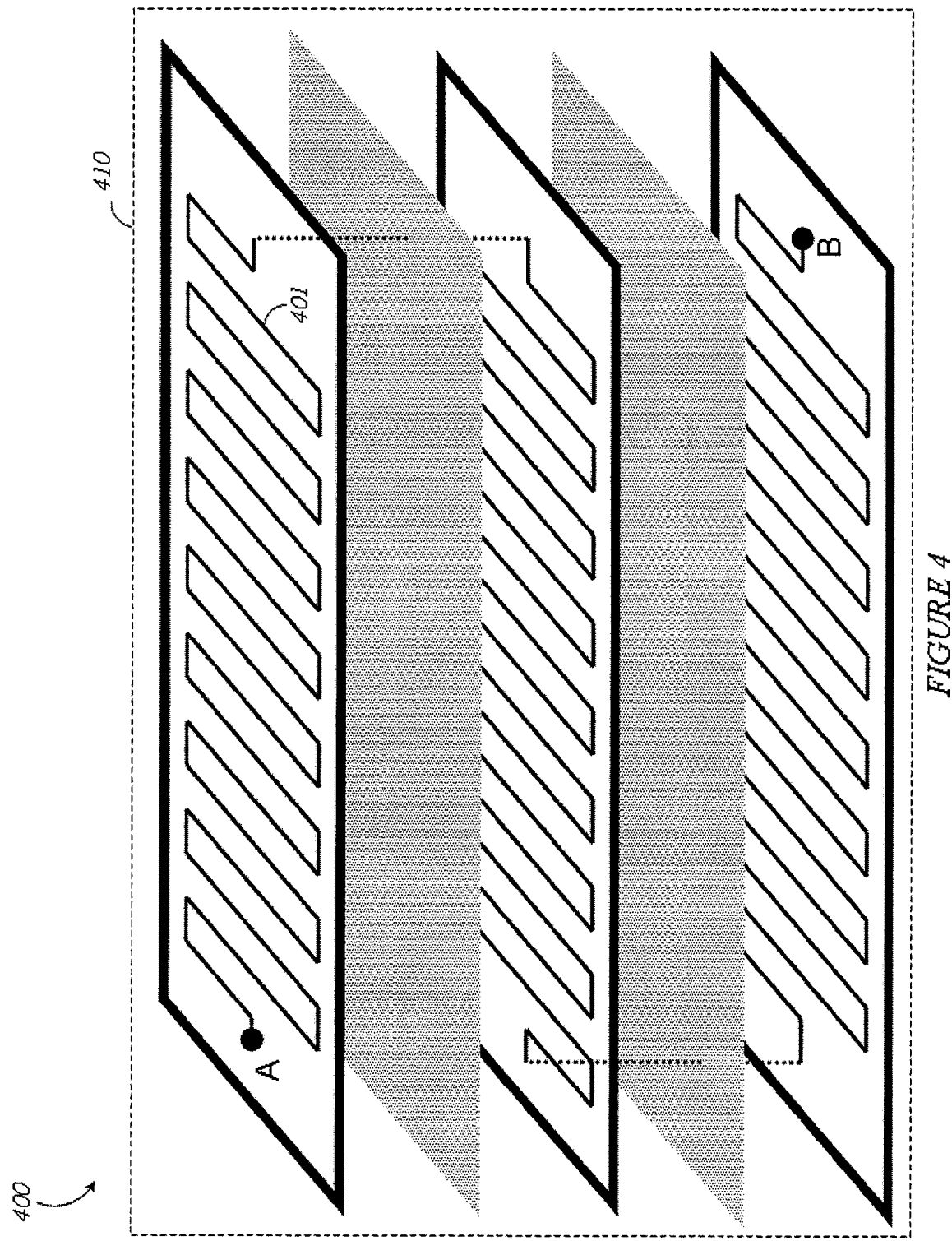
FIG. 4 is a schematic diagram of an embodiment of a meander filter that comprises a continuous meandering signal path that traverses multiple layers of a multilayer printed circuit board.

In some embodiments of a meander filter such as filter 300, an even greater length of signal path may be implemented if PCB 310 is a multilayer PCB. FIG. 4 is a schematic diagram of an embodiment of a meander filter 400 that comprises a continuous meandering signal path 401 that traverses multiple layers of a multilayer PCB 410. Each conductive layer in PCB 410 may be insulated from the other conductive layers by a layer of dielectric medium (represented by the grey dots in FIG. 4). In some embodiments, each conductive layer may couple to a respective ground plane layer as in filter 300 of FIG. 3, or each layer may couple to one common ground plane layer. Filter 400 functions in a similar way to filter 300, except that PCB 410 includes multiple layers and meander signal path 401 forms one continuous path that connects between multiple layers of PCB 410. In this way, meander signal path 401 may provide a much longer signal path and a greater inductance than meander signal path 301, within a PCB of similar dimensions. The signal path in filter 400 leads from point A to point B along meander signal path 401. The vertical dotted lines show conductive via connections between two layers of multilayer PCB 410. In some embodiments, it may be advantageous to ensure that sections of vertically-adjacent conductive traces in PCB 410 each direct current in the same direction. That is, where current traveling through the first layer of meander 401 propagates across the width of PCB 410 in one direction, it may be advantageous to ensure that current traveling through a second layer that immediately underlies the first layer of PCB 410 also propagates across the width of PCB 410 in that same direction. Such directional alignment can increase the mutual inductance between layers of PCB 410, thereby increasing the filtering performance of filter 400. Those of skill in the art will appreciate that multilayer filters such as filter 400 may, in some embodiments, be implemented as differential filters modeled by LEF 150 of FIG. 1B.

While meander signal path 401 traverses three layers of multilayer PCB 410, those of skill in the art will appreciate that any number of layers may be used. For embodiments in which meander signal path 401 is a superconducting trace, it may be necessary to establish superconducting communication between multiple layers of PCB 410. Systems, methods and apparatus for inter-layer superconducting communication in a multilayer superconducting PCB are fully described in U.S. Provisional Patent Application Ser. No. 60/979,031, filed Oct. 10, 2007, entitled "Systems, Methods, And Apparatus For Multilayer Superconducting Printed Circuit Boards" and in U.S. patent application Ser. No. 12/247,475. Furthermore, in some embodiments it can be advantageous to include a dissipation layer in between each respective set of adjacent pairs of layers in a multilayer PCB filter, such as filter 400.

A further aspect of the present systems, methods and apparatus is the incorporation of at least one discontinuous dissipative layer into various filtering structures. Filters 200, 300, and 400 have been described as being coupled to a dissipative layer from a distance (as in the case of coupling to a ground plane) and as being in direct contact with a continuous dissipative layer (as in the case of a lower-resistance metal plated to a higher-resistance metal). While a continuous dissipative layer may provide sufficient attenuation of unwanted signal frequencies in some applications, a continuous dissipative layer may also provide a transmission path to propagate signal frequencies that have been removed from the main signal path. Thus, in some embodiments it can be advantageous to incorporate a discontinuous dissipative layer into such filter structures to reduce direct propagation of unwanted signal frequencies between two considerably separated points in the signal path. A discontinuous dissipative layer may realize similar filtering effects as in metal powder filters. The principles governing the operation of typical metal powder filters are described in F. P. Milliken et al., 2007, *Review of Scientific Instruments* 78, 024701, and U.S. Provisional Patent Application Ser. No. 60/881,358 filed Jan. 18, 2007 and entitled "Input/Output System and Devices for Use with Superconducting Based Computing Systems", and U.S. patent application Ser. No. 12/016,801.

Figure 5:
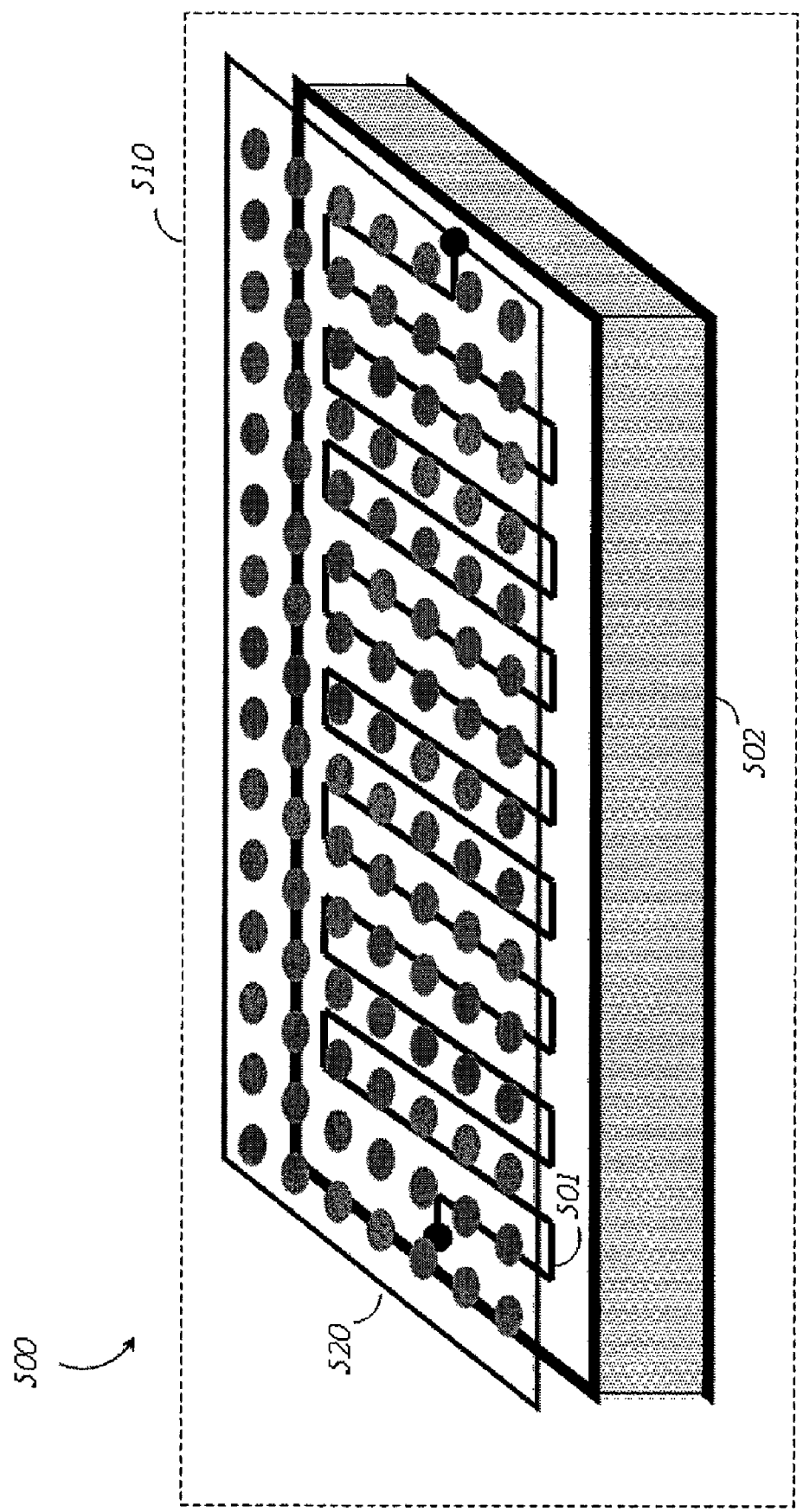
FIG. 5 is a schematic diagram of an embodiment of a meander filter that comprises a meandering signal path in a multilayer PCB that includes a discontinuous dissipative layer.

FIG. 5 is a schematic diagram of an embodiment of a meander filter 500 that comprises a meandering signal path 501 in a multilayer PCB 510 that includes a discontinuous dissipative layer 520. In filter 500, layer 520 comprises a plurality of disconnected metal structures 521 (only one called out in Figure). FIG. 5 illustrates these metal structures 521 as being circular in geometry and evenly distributed over layer 520, though those of skill in the art will appreciate that metal structures 521 of any geometry may be used and laid out in any regular or unpatterned fashion. Further, the metal structures of multiple different shapes may be employed on the same layer 520. For instance, in some embodiments desirable levels of dissipation may be achieved by arranging dissipative metal structures 521 in regions of higher magnetic fields, which may typically be located directly above or below the conductive traces. Thus, in some embodiments, disconnected metal structures 521 may be arranged to mirror the adjacent conductive traces. In still other embodiments, a dissipation layer may comprise a conductive trace that approximately mirrors the adjacent signal path. Such a dissipation layer may be made discontinuous by interrupting the mirror trace in at least one location, thereby producing a set of discontinuous metal structures in the shape of "bars."

Furthermore, a plurality of discontinuous dissipative layers may be incorporated into some embodiments of the present systems, methods and apparatus. In some embodiments, the disconnected metal structures in a discontinuous dissipative layer may be coupled to the signal path from a distance (as in FIG. 5). In other embodiments, the disconnected metal structures in a discontinuous dissipative layer may be in direct contact with the signal path by, for example, being plated on a surface of the signal path. In still other embodiments, a discontinuous dissipative layer may comprise fine metal particles embedded in a material, for example a dielectric medium such as the PCB substrate, or an epoxy, which is then placed in contact with, or within close proximity of, the signal path. In some embodiments, it may be advantageous to include a dissipation layer, either continuous or discontinuous, in between a ground layer and a signal path such that coupling to ground is mediated by the dissipation layer.

Meander filters such as filter 300, filter 400, and filter 500 are well-suited to be implemented on both rigid PCBs and flexible PCBs. In embodiments that are implemented on flexible PCBs, the present systems, methods and apparatus are well-suited to provide signal filtering while simultaneously providing a signal path between two spatially separated points. For instance, in a system requiring filtered electrical communication between two points X and Y, a meander filter in a flexible PCB cable may accomplish both objectives simultaneously. That is, meander filters are well-suited to providing signal filtering over a length of PCB (rigid or flexible) that provides an electrical connection between two points. Meander filters such as filters 300, 400 and 500 may satisfy the requirements of a wide range of applications. As previously discussed, a meandering signal path may be made substantially greater in length than a direct signal path within the same dimensional constraints, thereby increasing the inherent inductance of the signal path. This effect is used to contribute to the desired filtering performance. However, the mutual inductance between adjacent traces is another factor that may be taken into account in predicting the performance characteristics of a meander filter design.

Figure 6:
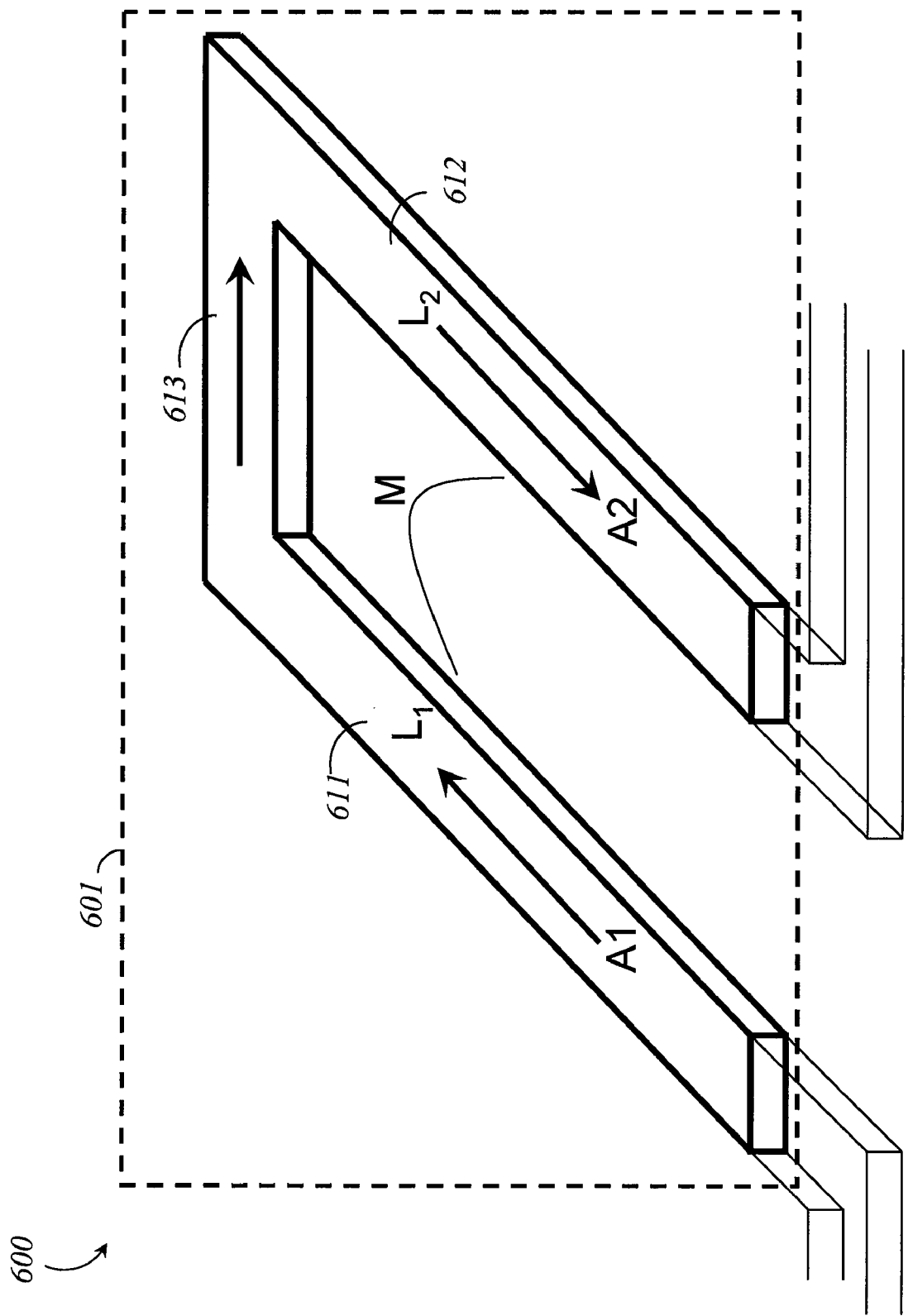
FIG. 6 is an isometric view of a portion of an embodiment of a meander filter.

FIG. 6 shows a portion 601 of an embodiment of a meander filter 600. The entire structure of filter 600 may be similar to any of filters 300, 400 and 500 from FIGS. 3-5, respectively. In particular, portion 601 of filter 600 includes conductive path 611 which guides an electrical signal in the direction of arrow A1 and conductive path 612 which guides an electrical signal in the direction of arrow A2. Paths 611 and 612 are galvanically coupled by conductive path 613 such that an electrical signal that flows in the direction of A1 in path 611 propagates through to flow in direction A2 in path 612. Direction A1 may be approximately anti-parallel to direction A2, and path 613 may be considerably shorter than paths 611 and 612. In some embodiments, paths 611-613 may be realized by conductive traces on a PCB, or superconducting traces on a superconducting PCB.

As previously discussed, a conductive path has an inherent inductance per unit length whose value may depend on the material and geometry of the path. Paths 611 and 612 each have a fixed length and therefore exhibit inductances of $L_1$ and $L_2$ respectively. These two terms combine to contribute an overall inductance of approximately $L_{path}=L_1+L_2$ to the meandering signal path (because path 613 is considerably shorter than paths 611 and 612 in this embodiment, the inductance contribution from path 613 may be negligible). However, the mutual inductance M between paths 611 and 612 is another factor that may contribute to the overall inductance of the meandering signal path formed by paths 611-613 in portion 601 of filter 600. Because current may flow in approximately opposite directions in paths 611 and 612 (directions A1 and A2, respectively), this mutual inductance M may be negative and therefore reduce the total inductance of the meandering signal path. The total inductance of the meandering signal path comprising paths 611-613 in portion 601 of filter 600 may be represented by $L_{tot}=L_{path}-M=L_1+L_2-M$. In some embodiments of meander filters, it may be advantageous to increase the length of the meandering signal path in order to increase the corresponding positive $L_{path}$ contribution to the total inductance $L_{tot}$. However, it may also be advantageous to reduce the mutual inductance between adjacent approximately anti-parallel paths throughout the meandering signal paths in order to reduce the corresponding negative M contribution to the total inductance $L_{tot}$. This mutual inductance may be reduced by, for example, reducing the lengths of approximately anti-parallel signal paths (such as paths 611 and 612) and increasing the size of the gap between approximately anti-parallel signal paths. Therefore, in some embodiments of meander filters such as filters 300-600, it may be advantageous to account for the effects of both increased signal path length and mutual inductance in order to produce the desired filtering performance.

In some embodiments, the effects of the negative mutual inductance between adjacent approximately anti-parallel signal paths in a meander filter design may be mitigated by shielding each pair of adjacent approximately anti-parallel signal paths from one another. For example, a strip of metal may be inserted in between paths 611 and 612 in filter 600 to reduce the mutual inductance M in between paths 611 and 612. A similar metal strip, or "finger", may be positioned in between each pair of adjacent approximately anti-parallel signal paths in a meander filter. In some embodiments, a metal finger may be an electrically coupled extension from a ground plane.

Figure 7A:
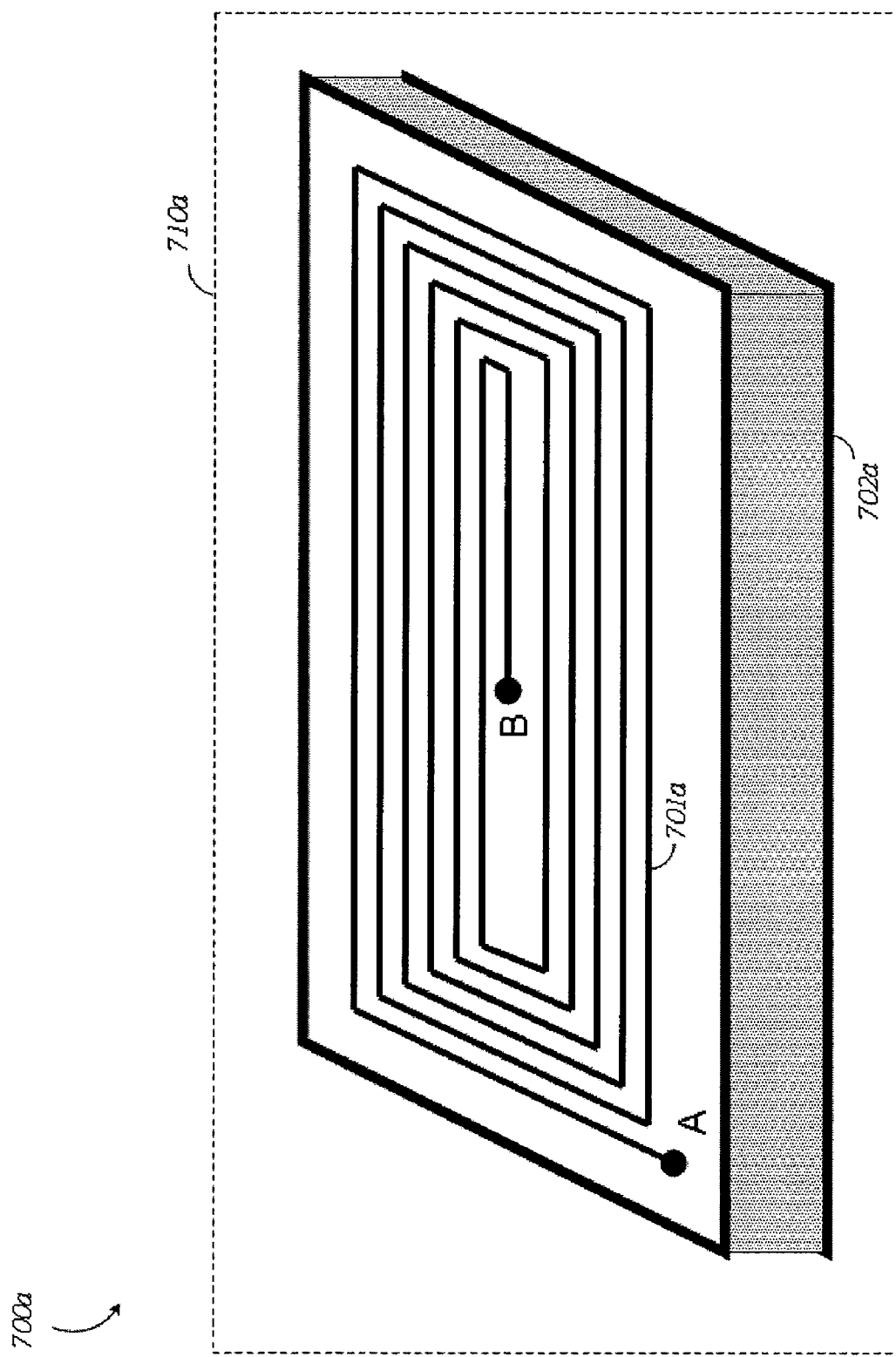
FIG. 7A is a schematic diagram of an embodiment of a passive low-pass filter that comprises a coil signal path on a first layer of a printed circuit board.
Figure 7B:
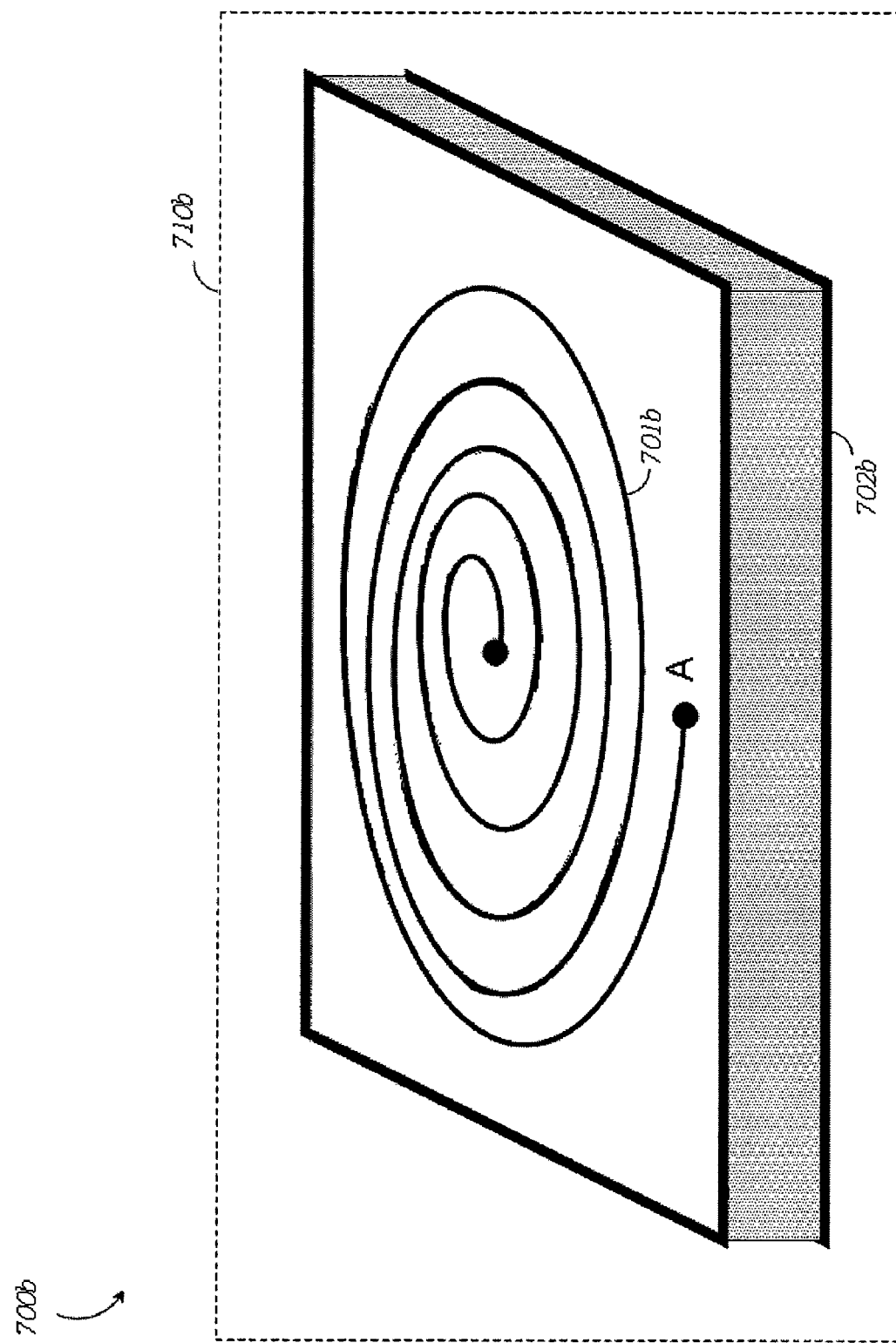
FIG. 7B is a schematic diagram of an embodiment of a passive low-pass filter that comprises a spiral signal path on a first layer of a printed circuit board.

The present systems, methods and apparatus also describe embodiments of PCB-based electrical signal filters that provide a positive mutual inductance between adjacent signal paths to further increase filtering performance. Positive mutual inductances between adjacent signal paths may be realized by ensuring signals propagate in an approximately parallel direction in the adjacent signal paths as opposed to an approximately anti-parallel direction as in meander filters 300-600. This effect may be produced by a coil or spiral signal path configuration. FIG. 7A is a schematic diagram of an embodiment of a passive low-pass filter 700a that comprises a coil signal path 701a on a first layer of a PCB 710a; and FIG. 7B is a schematic diagram of an embodiment of a passive low-pass filter 700b that comprises a spiral signal path 701b on a first layer of a printed circuit board 710b. The operating principles of the filters 700a, 700b are similar to those of meander filters 300-600. That is, the coil 701a or spiral 701b configurations extend the length of the path connecting between points A and B on PCBs 710a and 710b, respectively. Paths 701a and 701b each have an inherent inductance per unit length, and the coil or spiral geometries each increase the inductance of the respective signal path. Furthermore, the coil or spiral configurations of FIGS. 7A and 7B, respectively, allow electrical signals traveling through adjacent approximately parallel paths to propagate in an approximately parallel direction as opposed to an approximately anti-parallel direction as in meander filters 300-600.

FIG. 8 is an isometric view of a portion 801 of an embodiment of a coil filter 800. Only a portion 801 of coil filter 800 is shown in FIG. 8, while the entire structure of the coil filter 800 may be similar to many different embodiments of coil or spiral filters, such as filters 700a and 700b from FIGS. 7A and 7B, respectively. In particular, portion 801 of coil filter 800 includes conductive path 811 which guides an electrical signal in the direction of arrow A1 and conductive path 812 which guides an electrical signal in the direction of arrow A2. Paths 811 and 812 are galvanically coupled (not shown), as they each represent a respective part of a continuous coil signal path such as path 701a from FIG. 7A. An electrical signal that flows in the direction of A1 in path 811 propagates through to flow in direction A2 in path 812. Direction A1 may be approximately parallel to direction A2. In some embodiments, paths 811 and 812 may be realized by conductive traces on a PCB, or superconducting traces on a superconducting PCB. Paths 811 and 812 each have a fixed length and therefore exhibit inductances of $L_1$ and $L_2$ respectively. These two terms combine to contribute an overall inductance of approximately $L_{path}=L_1+L_2$ to the coil signal path. Furthermore, the mutual inductance M between paths 811 and 812 is another factor that may contribute to the overall inductance of the coil signal path in portion 801 of filter 800. Because current may flow in the same direction in both paths 611 and 612 (directions A1 and A2, respectively), this mutual inductance M may be positive and therefore increase the total inductance of the coil signal path. The total inductance of the coil signal path comprising paths 811 and 812 in portion 801 of filter 800 may be represented by $L_{tot}=L_{path}+M=L_1+L_2+M$. Thus, for a given length of signal path a coil filter such as coil filter 700a may realize a higher inductance than a meander filter such as meander filter 300.

The embodiments of PCB-based coil filters shown in FIGS. 7A and 8 are square coils with a right-angle at each turn. However, those of skill in the art will appreciate that coils of any geometry (including circular, triangular, hexagonal, etc.) may similarly be employed according to the present systems, methods and apparatus. Dissipation in a coil filter, such as coil filter 700a, may be realized through any of the exemplary means described for meander filters 300-600. That is, coil filter 700a in FIG. 7A is illustrated with a capacitive coupling to ground plane 702a that is similar to that described for meander filter 300 in FIG. 3. Those of skill in the art will appreciate that a dissipative layer may also be directly coupled to layer 701a as in, for example, plating by a metal of higher resistance. Similarly, a discontinuous dissipative layer ("metal structures") may be incorporated in a coil or spiral filter in a similar fashion to the incorporation of layer 520 into meander filter 500. In some embodiments, a discontinuous dissipation layer may also comprise a plurality of metal particles embedded in a dielectric medium such as the PCB substrate, or an epoxy, that is placed in contact with, or in close proximity to, a coil or spiral signal path.

In FIG. 4, an exemplary embodiment of a meander filter 400 formed by a continuous meandering signal path 401 that traverses multiple layers in a multilayer PCB 410 was described. Similarly, in some embodiments a coil or spiral filter, such as filters 700a and 700b, may include a continuous coil or spiral signal path that traverses multiple layers in a multilayer PCB.

Figure 9:
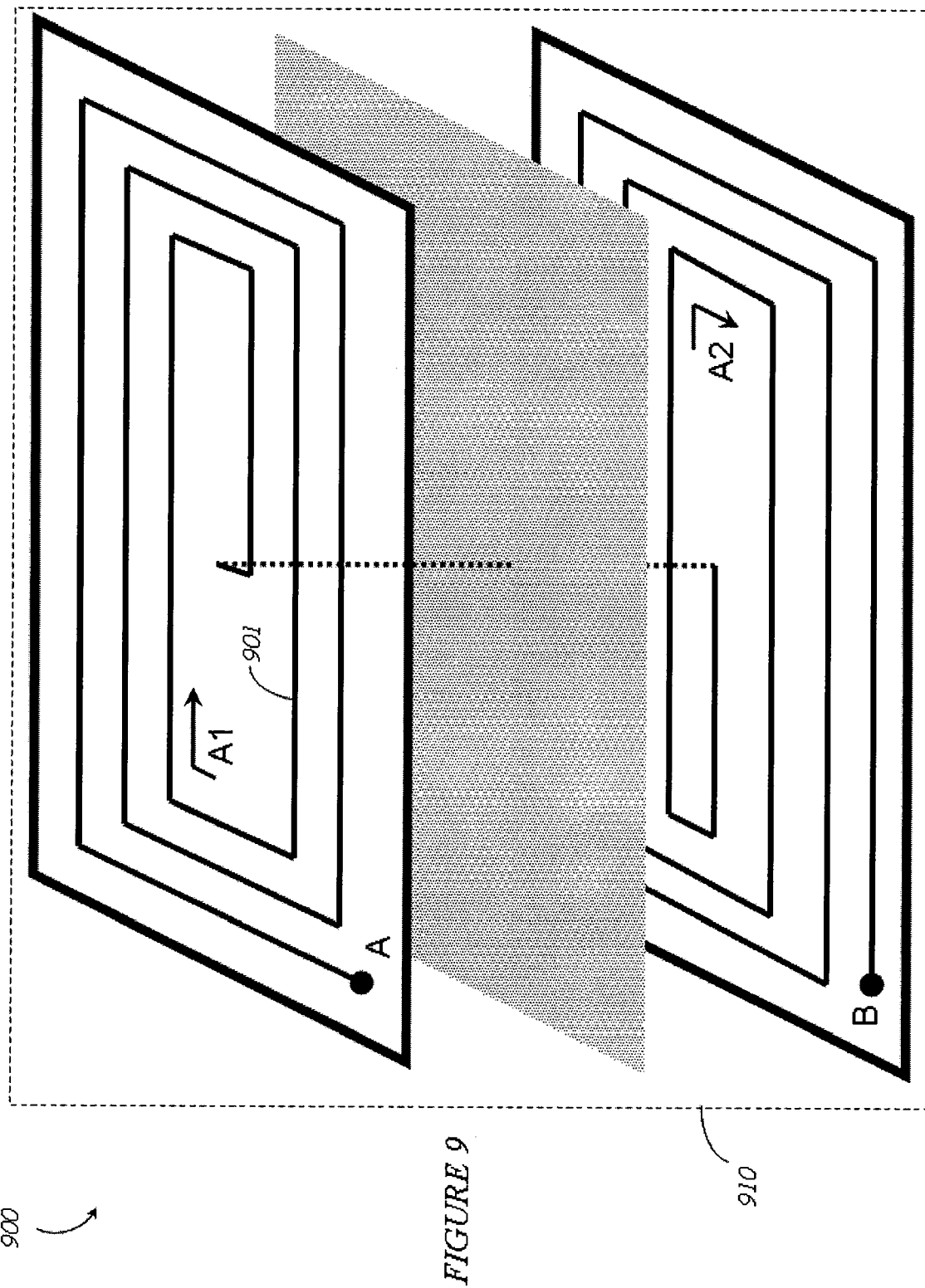
FIG. 9 is a schematic diagram of an embodiment of a coil filter that comprises a continuous coil or spiral signal path that traverses multiple layers of a multilayer PCB.

FIG. 9 is a schematic diagram of an embodiment of a coil filter 900 that comprises a continuous coil signal path 901 that traverses multiple layers of a multilayer PCB 910. PCB 910 is shown as having two conductive layers, though those of skill in the art will appreciate that any number of layers may be used. Each conductive layer in PCB 910 may be insulated from the other conductive layers by a layer of dielectric medium (represented by the grey dots in FIG. 9). Each conductive layer may couple to a respective ground plane layer or each layer may couple to one common ground plane layer. Coil filter 900 functions in a similar way to coil filter 700a of FIG. 7A, except that PCB 910 includes multiple layers and coil signal path 901 forms one continuous path that connects between multiple layers of PCB 910. In this way, coil signal path 901 may provide a much longer signal path and a greater inductance than coil signal path 701a from FIG. 7A, within a PCB of similar dimensions. The coil signal path 901 in filter 900 leads from point A to point B. The vertical dotted line indicates a conductive via connection between two layers of multilayer PCB 910. For embodiments in which the coil signal path 901 is a superconducting trace, it may be necessary to establish superconducting communication between multiple layers of PCB 910 according to the systems, methods and apparatus described in U.S. Provisional Patent Application Ser. No. 60/979,031, filed Oct. 10, 2007 and U.S. patent application Ser. No. 12/247,475.

In some embodiments of a multilayer coil or spiral filter such as coil filter 900, it may be advantageous to ensure that electrical signals traveling along the continuous spiraling signal path, such as coil signal 901, travel in approximately the same direction on each of the multiple layers. That is, if currents travel clockwise on a first layer of a PCB, it may be advantageous to layout the signal path such that currents also travel clockwise on a second layer of the PCB. This relation is illustrated in FIG. 9, as signals traveling from A to B are conducted in direction A1 on the first layer of PCB 910 and in direction A2 on the second layer of PCB 910, where direction A1 is approximately the same (i.e., clockwise) as direction A2. Ensuring that electrical signals propagate in the same direction on each layer of a multilayer PCB-based coil or spiral filter may realize additional mutual inductance effects to further increase the inductance of the signal path, thereby increasing filter performance.

Figure 10:
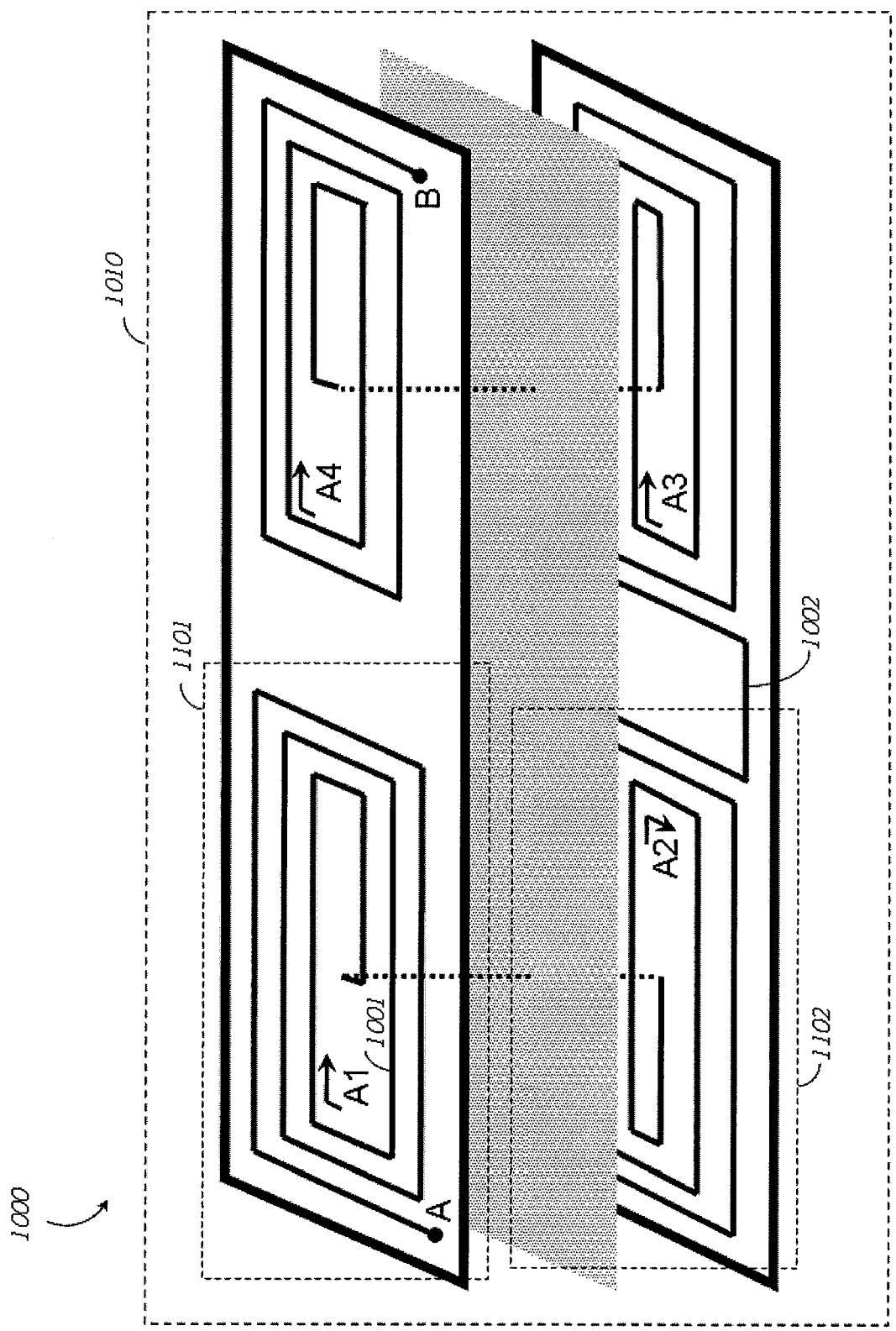
FIG. 10 is a schematic diagram of an embodiment of a coil filter that comprises a continuous signal path that includes multiple coils or spirals and traverses multiple layers of a multilayer PCB.

In some embodiments, the performance of a coil or spiral filter may also be increased by coupling a plurality of multilayer coils or spirals in series with one another. FIG. 10 is a schematic diagram of an embodiment of a coil filter 1000 that comprises a continuous coil signal path 1001 that includes multiple coils (1101 and 1102, only two called out in FIG. 10) and traverses multiple layers of a multilayer PCB 1010. Path 1001 guides a signal from point A to point B in PCB 1010, passing through two conductive vias (represented by dotted lines in FIG. 10) that communicate between multiple layers in PCB 1010. The embodiment of coil filter 1000 shown in FIG. 10 may operate in a similar way to the embodiment of coil filter 900 shown in FIG. 9. In fact, coil filter 1000 is essentially two embodiments of coil filter 900 that are coupled together in series by path 1002 and combined into one multilayer PCB 1010. Similar to coil filter 900, in some embodiments of coil filter 1000 it may be advantageous to ensure that electrical signals traveling along path 1001 travel in approximately the same direction in vertically adjacent layers of PCB 1010. For example, in coil filter 1000 signals travel in direction A1 through coil signal path 1101 and signals travel in direction A2 through coil signal path 1102. At least a portion of coil signal path 1102 is situated directly beneath coil signal path 1101 in PCB 1010. In coil filter 1000, directions A1 and A2 are both approximately clockwise which, as in coil filter 900, may realize additional mutual inductance effects to further increase the inductance of coil signal path 1001, thereby increasing the performance of coil filter 1000.

While FIG. 10 shows four coil signal paths coupled in series with one another (only coil signal paths 1101 and 1102 are called out in the Figure), those of skill in the art will appreciate that any number coil filters may be similarly combined depending on the desired filter performance. Furthermore, in some embodiments PCB 1010 may include additional layers which may similarly be traversed by coil signal path 1001, or which may include a ground layer or at least one continuous or discontinuous dissipation layer.

A further aspect of the present systems, methods and apparatus is the incorporation of magnetic shielding into PCB-based electrical filters. A PCB, either rigid or flexible, is well-suited to be fully enclosed by a metal shield. For example, a multilayer PCB may include a top-most layer of one continuous metal plane and similarly a bottom-most layer of one continuous metal plane. The edges of such a PCB may also be plated with metal, forming a complete metal enclosure that surrounds the multilayer PCB. Techniques for plating the edges of a PCB with metal are known in the art. Thus, a PCB-based electrical filter such as those described in the present systems, methods and apparatus may easily be contained, completely or in part, by a metal enclosure to provide the desired shielding from magnetic fields.

Furthermore, in embodiments that are applied at low temperatures, such as embodiments that are used to filter superconducting signals, the present systems, methods and apparatus are well-suited for reliable thermalization. That is, the planar geometry of a PCB, either rigid or flexible, provides accessible and relatively uniform surfaces to and from which thermal contacts may easily be made.

The present systems, methods and apparatus provide filtering devices that may be assembled using the reliable processes of PCB fabrication as opposed to the intricate and labor-intensive assembly of comparable filters, such as typical metal powder filters. Those of skill in the art will appreciate that lumped elements, such as inductors and capacitors, may be added to the various embodiments described herein according to the requirements of the specific system in which the present systems, methods and apparatus are being implemented. Those of skill in the art will also appreciate that the terms coupled or coupling typically refer to a communicative coupling, whether direct or indirect. Such communicative coupling typically takes the form of an electrical coupling, for instance conductively, superconductively, inductively, capacitively, or galvanically coupled.

The various embodiments of PCB-based filtering devices described herein may be implemented in a wide-range of applications. As an example, the various embodiments of PCB-based filtering devices described herein are well-suited to simplify the assembly of communicative connections in an input/output system. As such, the present systems, methods and apparatus describe the use of printed circuit board technology in input/output (I/O) systems. These I/O systems may provide communication means with any of a wide range of systems. Throughout the remainder of this specification, these I/O systems are described as providing communication with embodiments of computer processors, such as superconducting quantum processors. However, those of skill in the art will appreciate that the present systems, methods and apparatus may be implemented for other purposes and in conjunction with electronic systems other than computer processors.

An I/O system typically includes a plurality of signal paths that provide communication between at least two systems or devices. For instance, the "input" portion of an I/O system may provide communication between a programmer or controller and a system to be programmed or controlled, such as a computer processor. Similarly, the "output" portion of an I/O system may provide communication between a system from which information is to be read out (such as a computer processor) and a measuring, recording, or feedback system. The plurality of signal paths may be realized by a plurality of conductive wires or cables, such as coaxial cables. Within an I/O system, it may be advantageous to include components or devices for filtering the electrical signals. Examples of I/O system that include conductive cables and signal filtering components are fully described in U.S. Provisional Patent Application Ser. No. 60/881,358 filed Jan. 18, 2007, entitled "Input/Output System and Devices for Use with Superconducting Based Computing Systems", U.S. patent application Ser. No. 12/016,801, and U.S. Provisional Patent Application Ser. No. 61/080,996, filed Jul. 15, 2008 and entitled "Input/Output System and Devices for Use with Superconducting Devices."

While I/O systems that are based on conductive wires or cables may be appropriate for some applications, such designs can exhibit certain drawbacks. For instance, an I/O system that includes conductive cables can become very difficult to manage as the number of cables increases; reliably establishing all of the correct connections in an I/O system that uses hundreds of individual conductive cables can be quite labor-intensive; and signal filtering in such a system can necessitate the manufacture of elaborate and complicated filtering devices, such as metal powder filters. The challenge of managing a large number of individual conductive cables is often mitigated by the use of large multi-channel/multi-cable components (e.g., a metal powder filter) as opposed to individual cable-specific devices. However, the inclusion of such multi-cable components can pose a serious risk whereby a fault in a single cable can necessitate replacement of the entire system. All of these aspects, and many others, may combine to make typical I/O systems that are based on conductive cables unreliable, complex and difficult to repair or maintain, and very labor-intensive to assemble. Thus, there is a need in the art for an I/O system design that is more reliable and easy to assemble and repair, while still meeting the required performance specifications.

Figure 11:
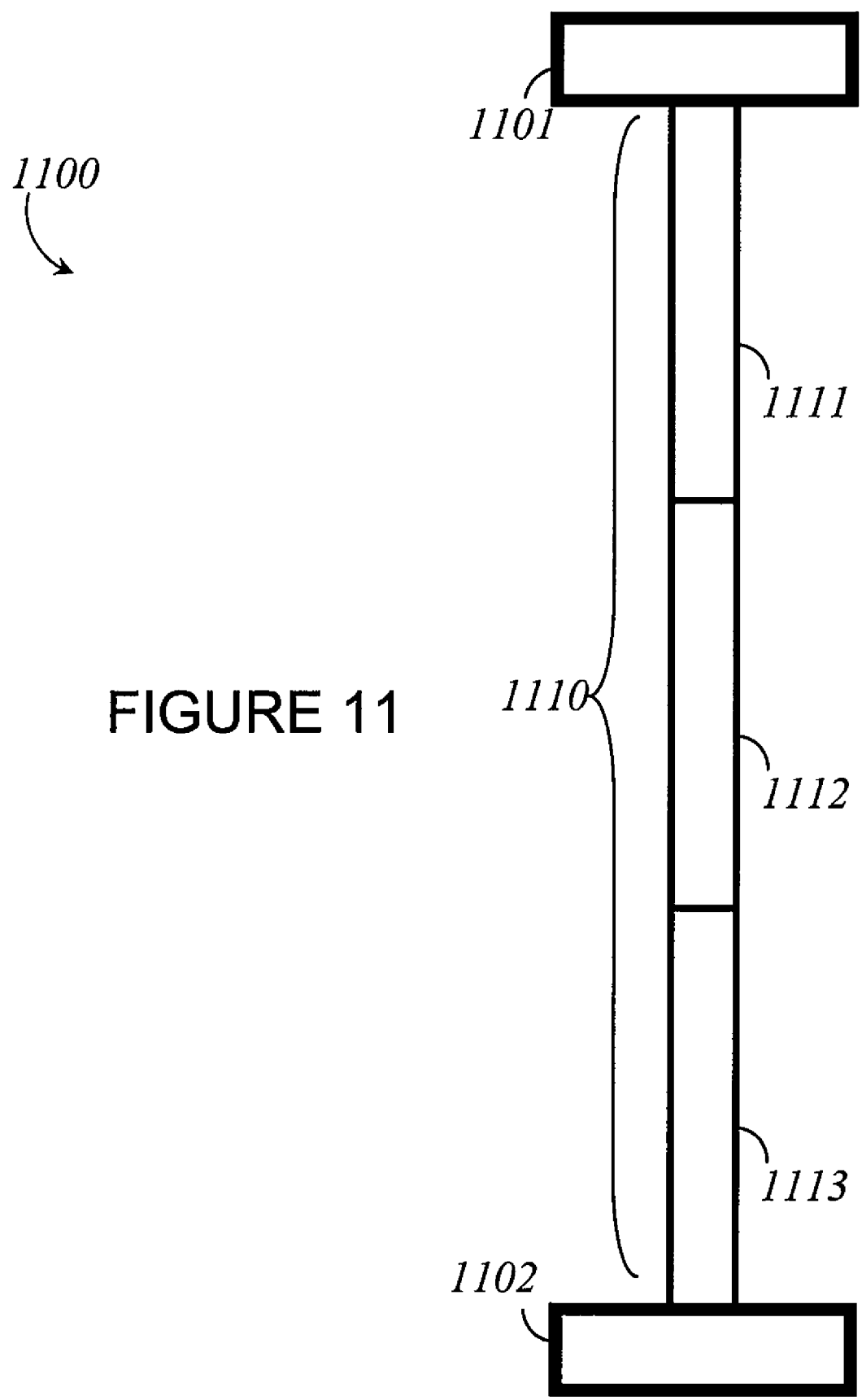
FIG. 11 is a schematic diagram of an embodiment of an I/O system that includes at least one printed circuit board component.

FIG. 11 is a schematic diagram of an embodiment of an I/O system 1100 that includes at least one PCB component. I/O system 1100 forms at least one communicative connection 1110 between two components, 1101 and 1102 respectively. In some embodiments, I/O system 1100 may be used to provide communication between a programmer or controller and a computer processor, such as a superconducting quantum processor. In such embodiments, component 1101 may include a programmer or controller or a connection terminal coupled to a programmer or controller, and component 1102 may include a computer processor or a connection terminal coupled to a computer processor. The communicative connection 1110 between components 1101 and 1102 may include one or a plurality of PCB based stages (i.e., stages formed by, on or within PCBs and/or PCB substrates). As illustrated in FIG. 11, I/O system 1100 includes three stages 1111-1113 in the communicative connection 1110 between components 1101 and 1102. However, those of skill in the art will appreciate that any number of stages may be included depending on the requirements of the specific system in which such an I/O system is being implemented. A second stage may differ from a first stage in a variety of ways, including but not limited to: the physical form of that portion of the communicative connection (i.e., PCB, coaxial cable, etc.), the material(s) of which the stage is comprised (i.e., superconducting, non-superconducting, etc.) and the nature of any other devices included within that stage (i.e., filtering devices, thermalization points, etc.).

Any or all of the three stages 1111-1113 in communicative connection 1110 may be realized by at least one conductive trace on at least one PCB. In some embodiments, the at least one PCB may include a rigid PCB; in some embodiments, the at least one PCB may include a flexible PCB. In some embodiments of I/O system 1100, component 1101 may include a connection terminal at room temperature and component 1102 may include a superconducting quantum processor. In such embodiments, stage 1111 may include a PCB (flexible or rigid) with at least one conductive trace that is composed of non-superconducting material. Stage 1112 may then include a PCB (flexible or rigid) with at least one conductive trace that is at least partially composed of superconducting material such that at least a portion of an electrical signal traveling through stage 1112 of communicative connection 1110 is superconducting. Thus, in some embodiments the transition from stage 1111 to stage 1112 may be realized by a connection between two PCBs, one of which includes at least one non-superconducting trace (stage 1111) and the other of which includes at least one superconducting trace (stage 1112). In other embodiments, stages 1111 and 1112 may both be realized on the same physical PCB where the material used to realize the conductive traces only becomes superconducting once the electrical signal has progressed to stage 1112 in communicative connection 1110.

The embodiment of I/O system 1100 illustrated in FIG. 11 may be used for establishing input/output communication through a communicative connection 1110 between a superconducting device 1102 and room temperature electronics 1101. In such embodiments, the communicative connection 1110 may include at least two stages 1111 and 1112, where a first stage 1111 includes non-superconducting communication and a second stage 1112 includes superconducting communication. Some embodiments of the present systems, methods and apparatus may include a filtering stage. In I/O system 1100, stage 1113 may include one or a plurality of PCB-based electrical filters such as those described in FIGS. 1-10. For example, stage 1113 may be realized by a PCB (flexible or rigid) within or upon which at least one conductive trace forms a circuitous route such as a meandering path (FIGS. 3-6), a coiling path (FIGS. 7A, 9, 10), or a spiral path (FIGS. 7B, 9, 10). The conductive trace may be communicatively coupled to a dissipation means such that the circuitous route provides the desired electric signal filtering. In embodiments of I/O system 1100 where component 1102 is superconducting or at least one of stages 1111 and 1112 is superconducting, at least a portion of stage 1113 may also be superconducting.

Some embodiments of the present systems, methods and apparatus describe an I/O system including at least one communicative connection between two components, wherein the communicative connection is physically realized by one laminate piece of PCB comprising multiple stages. In other embodiments, the communicative connection may be physically realized by a sequence or chain of connected PCBs, wherein each PCB represented a specific stage. In some embodiments, the communicative connection may include a filtering stage, which may be realized by PCB-based electrical filters. In FIG. 11, such a filtering stage 1113 is illustrated as occurring near the end of communicative connection 1110. However, those of skill in the art will appreciate that the sequence or order of the stages 1111-1113 may vary depending on the requirements of the I/O system being implemented. Furthermore, in some embodiments, at least one additional stage in communicative connection 1110 may be included after filtering stage 1113.

The various embodiments described herein may be realized using flexible PCBs, rigid PCBs, or a combination of the two. For example, in I/O system 1100 of FIG. 11, the entirety of communicative connection 1110 may be formed of flexible PCB, or the entirety of communicative connection 1110 may be formed of rigid PCB, or each of the various stages 1111-1113 of communicative connection 1110 may be formed of either flexible or rigid PCB depending on the requirements of the system. In some embodiments, lump elements such as resistors, inductors and capacitors may be integrated into or between various stages to produce the desired filtering and/or matching characteristics.

In some embodiments, each PCB in communicative connection 1110 may include one or a plurality of signal channels.

Figure 12:
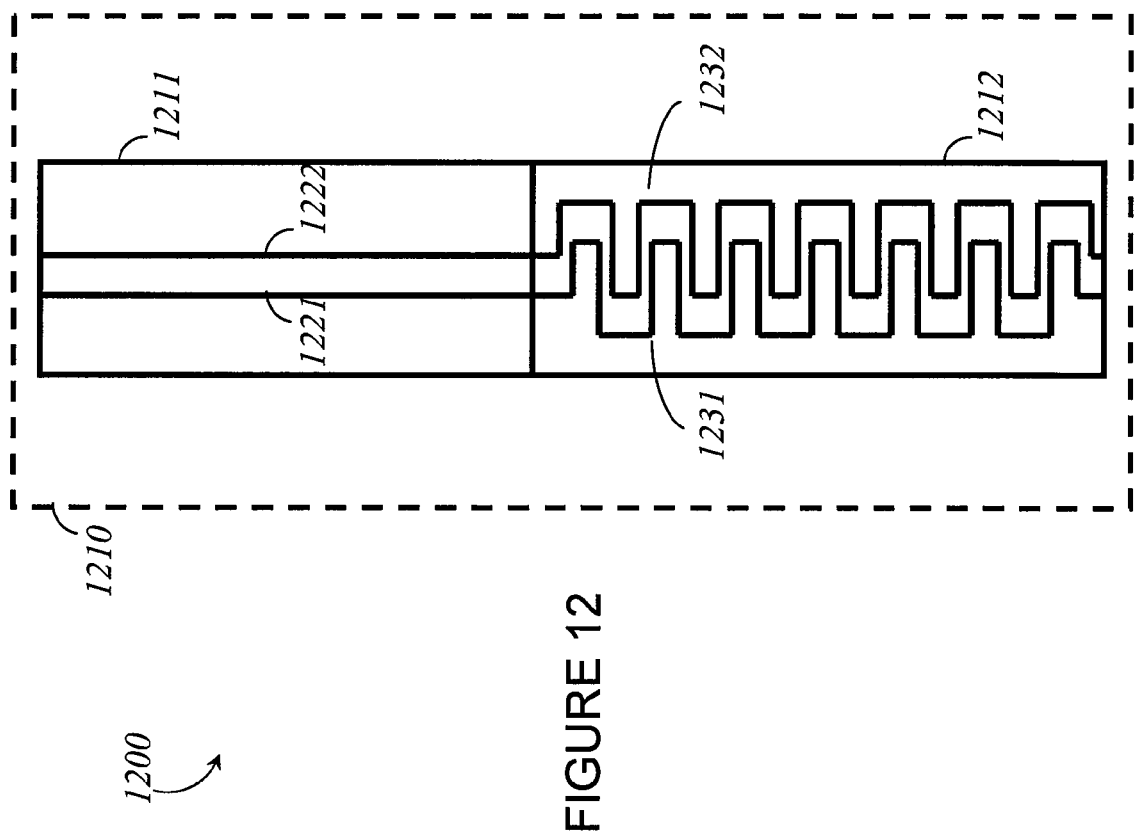
FIG. 12 is a schematic diagram of an embodiment of an I/O system that includes multi-channel PCB components.

FIG. 12 is a schematic diagram of an embodiment of a multi-channel I/O system 1200 that includes multi-channel PCB components. I/O system 1200 includes at least one communicative connection 1210, only a portion of which is illustrated in FIG. 12. Communicative connection 1210 includes two stages 1211 and 1212, respectively. In some embodiments, each stage in communicative connection 1210 may comprise at least one multi-channel PCB (flexible or rigid). Thus, stage 1211 may include a flexible multi-channel PCB that includes at least two channels, each being realized by a respective conductive trace. In multi-channel I/O system 1200, the two channels are realized by conductive traces 1221 and 1222. In some embodiments, conductive traces 1221 and 1222 may be non-superconducting traces made of non-superconducting metal. In other embodiments, conductive traces 1221 and 1222 may be superconducting traces made of superconducting metal alone, or superconducting traces made of superconducting metal plated upon non-superconducting metal. Conductive traces 1221 and 1222 from stage 1211 may each connect to a respective conductive trace in stage 1212. Stage 1212 is a filtering stage that may include a multi-channel PCB (flexible or rigid) that includes at least two channels, each being realized by a respective conductive trace. In stage 1212, the two channels are realized by meandering conductive traces 1231 and 1232 similar to meander filters 300-600. In some embodiments, conductive traces 1231 and 1232 may form a spiral or coil path as opposed to a meander, similar to filters 700a and 700b.

In multi-channel I/O system 1200, two channels are illustrated in each stage of communicative connection 1210. However, those of skill in the art will appreciate that any number of channels may similarly be incorporated into alternative embodiments of such an I/O system. For example, a communicative connection such as communicative connection 1110 or 1210 may include eight signal channels, sixteen signal channels, or any number of signal channels. Furthermore, only an outer layer of the PCBs illustrated in FIG. 11 and FIG. 12 is shown. In some embodiments, any stage of a communicative connection such as communicative connection 1110 or 1210 may include a multilayer PCB. In such embodiments, at least one signal channel may be included on each layer in a multilayer PCB. Alternatively, at least one signal channel may traverse multiple layers in a multilayer PCB through one or more vias. In the case of a superconducting channel traversing multiple layers in a multilayer PCB, a superconducting via may be formed as described in U.S. Provisional Patent Application Ser. No. 60/979,031, filed Oct. 10, 2007 and entitled "Systems, Methods and Apparatus for Multilayer Superconducting Printed Circuit Boards", and U.S. patent application Ser. No. 12/247,475.

FIG. 13 is a schematic diagram of an embodiment of an I/O system 1300 with a communicative connection 1310 that includes a flexible PCB 1311 and a multilayer flexible PCB 1312. PCB 1311 includes six signal channels realized by conductive traces 1321-1326. In some embodiments, conductive traces 1321-1326 may be formed of non-superconducting metal. In other embodiments, conductive traces 1321-1326 may be formed of superconducting metal, or superconducting metal plated upon non-superconducting metal. Furthermore, while six signal channels are used in I/O system 1300, those of skill in the art will appreciate that any number of signal channels may be used. Flexible PCB 1311 connects to multilayer flexible PCB 1312 through connector 1350, where each of conductive traces 1321-1326 is routed to a respective layer in multilayer flexible PCB 1312. PCB 1312 includes seven layers, 1341-1347 wherein layers 1341-1346 each include a meandering conductive trace 1331 (only one shown, 1331) that is connected, through connector 1350, to a respective one of conductive traces 1321-1326 in PCB 1311. For example, conductive trace 1321 from PCB 1311 may connect, through connector 1350, with meandering conductive trace 1331 on layer 1341 of PCB 1312. Similarly, conductive trace 1322 from PCB 1311 may connect, through connector 1350, with a second meandering conductive trace (not shown) on layer 1342 of PCB 1312. In some embodiments, at least one layer of PCB 1312, such as layer 1347, may include a dissipation layer that is communicatively coupled with at least one meandering conductive trace on at least one of layers 1341-1346. In some embodiments, layer 1347 of PCB 1312 may include a ground plane, which may or may not be used as a dissipation layer. Similarly, PCB 1311 may include a ground plane on the surface opposite that upon which conductive traces 1321-1326 are formed.

In I/O system 1300, multilayer PCB 1312 may be used to provide electronic filtering of the six signals carried through conductive traces 1321-1326, respectively. I/O system 1300 uses meandering conductive traces to provide the desired filtering characteristics. In alternative embodiments, coil or spiral configurations may be used as described previously. Furthermore, each conductive path in multilayer PCB 1312 of I/O system 1300 is located on a respective layer of PCB 1312. Those of skill in the art will appreciate that, in alternative embodiments, any layer of PCB 1312 may include multiple signal paths, or any signal path may traverse multiple layers of PCB 1312 through vias. For example, in some embodiments both conductive traces 1321 and 1322 from PCB 1311 may connect, through connector 1350, to a respective conductive trace on layer 1341 of PCB 1312. In some embodiments, conductive trace 1331 on layer 1341 of PCB 1312 may pass through a via (not shown) and connect to a meandering signal path (not shown) on at least one additional layer, such as layer 1342, of PCB 1312.

In some embodiments, an I/O system may comprise a single multi-channel communicative connection such as communicative connection 1210. However, in larger I/O systems, it may be advantageous to include a plurality of single or multi-channel communicative connections.

FIG. 14 is a schematic diagram of an embodiment of an I/O system 1400 that includes a plurality of communicative connections 1410a-1410d. I/O system 1400 includes four communicative connections 1410a-1410d; however, those of skill in the art will appreciate that any number of communicative connections may be used. All or any one of communicative connections 1410a-1410d may include multiple signal channels, as in communicative connection 1210 of FIG. 12. Communicative connections 1410a-1410d may each be formed by a respective PCB (flexible or rigid) or a respective sequence of multiple PCBs (flexible or rigid). As illustrated in FIG. 14, each of communicative connections 1410a-1410d includes three stages (1411a-1413a, 1411b-1413b, 1411c-1413c, and 1411d-1413d, respectively), though those of skill in the art will appreciate that any number of stages may be used in each of communicative connections 1410a-1410d and that, in some embodiments, each communicative connection need not have the same number of stages. In some embodiments, each of communicative connections 1410a-1410d may include a respective filtering stage 1413a-1413d. An I/O system with multiple communicative connections, such as I/O system 1400, may be advantageous in applications where components 1401 and 1402 require many input/output connections, or in applications where the input/output connections on at least one of components 1401 and 1402 are spatially separated to such a degree that it is more practical to incorporate multiple communicative connections.

As previously described, I/O systems that are based on conductive wires or cables can be difficult and labor-intensive to assemble and repair. For instance, the I/O system described in U.S. patent application Ser. No. 12/016,801 includes a single metal powder filter bar through which each of the conductive cables transmits a respective signal. A disadvantage of this system, and other systems that incorporate elaborate multi-channel components, is that a problem with any one channel in the metal powder filter bar can necessitate the replacement of the entire metal powder filter bar. Conversely, an advantage of the various embodiments of I/O systems based on PCB components described herein is the inherent modularity in the design. In a PCB-based I/O system that includes a plurality of communicative connections, such as I/O system 1400, a problem with any one communicative connection, for example communicative connection 1410c, may be readily resolved by simply replacing that communicative connection. Because each communicative connection 1410a-1410d may include its own respective stages, the replacement of any individual communicative connection may not impact the other communicative connections in the system. Furthermore, the assembly of any PCB-based communicative connection, such as communicative connections 1410a-1410d, as well as the assembly of any replacement communicative connections, is a comparatively simple procedure that may incorporate well-established PCB fabrication processes. Many copies of each PCB-based communicative connection may be produced and stored as potential replacements with little extra labor or cost. A repair procedure, then, may involve simply disconnecting a problematic communicative connection and, in its place, connecting a replacement communicative connection. Such modular repair is further facilitated in embodiments where a communicative connection is established using a single laminate piece of PCB comprising multiple stages.

In embodiments of the present systems, methods and apparatus that include multiple stages in a communicative connection that are connected in series through at lease one connector, such as communicative connection 1310 in I/O system 1300 of FIG. 13, an additional level of modularity may be realized. While the entirety of communicative connection 1310 may be replaced if desired, it may also be advantageous to replace only one stage in the communicative connection. For instance, if the filtering requirements of communicative connection 1310 change, then stage 1312 of communicative connection 1310 may be replaced with an alternative filtering configuration that meets the desired specifications.

In some embodiments of the present systems, methods and apparatus, it may be advantageous to include some form of electrical and/or magnetic shielding. The various embodiments described herein incorporate PCB components which may include a respective metal plane both above and/or beneath the signal channel layer(s) and metal plating around the edges of the board. Thus, using established PCB fabrication processes, the PCB components in some embodiments of I/O systems may be fully enclosed by on-board metal layers to provide a desired electrical shielding characteristic.

A further aspect of the present systems, methods and apparatus that may be advantageous in some applications is the relatively large surface area of an approximately planar PCB. In, for example, a refrigerated environment, this characteristic may provide more efficient thermalization compared to a conductive wire or cable. The thermalization of PCB components may be even further improved by including at least one thermalization layer (e.g., including a material with a high thermal conductivity) in the design of a multilayer PCB. Such a layer may be designed to exchange thermal energy with clamps and other contact points in the refrigerated environment.

FIG. 15 is an isometric view of a portion of an I/O system 1500 showing a communicative connection 1510 in thermal contact with a refrigeration component through a clamp 1560. In I/O system 1500, communicative connection 1510 is realized by a flexible PCB, though only a portion of communicative connection 1510 is visible in FIG. 15. Clamp 1560 is in contact, either directly or through at least one additional component, with a cold point in the refrigeration system. Communicative connection 1510 passes through a passage, such as passage 1561, in clamp 1560 and clamp 1560 is made sufficiently tight such that secure physical contact is made between clamp 1560 and communicative connection 1510 to provide thermal conduction therebetween. Similarly, communicative connection 1510 passes through another clamp 1570 at a different temperature stage in the refrigeration system. Those of skill in the art will appreciate that I/O system 1500 may include a number of similar thermalization clamps to ensure the desired cooling of communicative connection 1510. Furthermore, in some embodiments I/O system 1500 may include at least one additional communicative connection similar to communicative connection 1510 that passes through one of the holes adjacent to hole 1561 in clamp 1560.

The various embodiments of PCB-based I/O systems described herein may be advantageous over alternative systems that are based on conductive wires or cables because of their relative ease of assembly and maintenance. Furthermore, the various embodiments of PCB-based I/O systems described herein may occupy significantly less volume than alternative systems that are based on conductive wires or cables. In applications for which spatial constraints must be considered, such as a superconducting application inside a refrigerated environment, the inherent miniaturization of the present systems, methods and apparatus can be advantageous.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to electrical signal filtering systems, methods and apparatus, not necessarily the exemplary electrical signal filtering systems, methods, and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Provisional Patent Application Ser. No. 60/981,764, filed Oct. 22, 2007, entitled "Systems, Methods, and Apparatus For Electronic Filters", U.S. Provisional Patent Application Ser. No. 60/988,708, filed Nov. 16, 2007, entitled "Modular Input/Output System and Devices Incorporating Printed Circuit Board Components", U.S. Pat. No. 6,838,694. U.S. Pat. No. 7,335,909, US Patent Publication No. 2006-0225165, U.S. patent application Ser. No. 12/013,192, U.S. Provisional Patent Application Ser. No. 60/986,554 filed Nov. 8, 2007, entitled "Systems, Devices and Methods for Analog Processing", U.S. Provisional Patent Application Ser. No. 61/039,710, filed Mar. 26, 2008, entitled "Systems, Devices, And Methods For Analog Processing", U.S. Patent Publication No. 2006-0147154, U.S. patent application Ser. No. 12/017,995, U.S. Provisional Patent Application Ser. No. 60/979,031, filed Oct. 10, 2007, entitled "Systems, Methods, And Apparatus For Multilayer Superconducting Printed Circuit Boards," U.S. patent application Ser. No. 12/247,475, U.S. patent application Ser. No. 12/016,801, U.S. Provisional Patent Application Ser. No. 60/881,358 filed Jan. 18, 2007, entitled "Input/Output System and Devices for Use with Superconducting Based Computing Systems", and U.S. Provisional Patent Application Ser. No. 61/080,996, filed Jul. 15, 2008 and entitled "Input/Output System and Devices for Use with Superconducting Devices" are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrical signal filtering device comprising:
a dielectric medium;
a first continuous conductive path carried by the dielectric medium that forms a first circuitous route for connecting a first pair of points on the dielectric medium, the first continuous conductive path comprising a first conductive layer formed of a conductive metal having a first resistance and a first dissipative layer formed of a conductive metal having a second resistance that is higher than the first resistance, the first conductive layer and the first dissipative layer plated one on top of the other such that the first conductive layer provides a path through which an electrical signal flows and the first dissipative layer provides dissipation of unwanted signal frequencies; and
a second continuous conductive path that establishes a second circuitous route for connecting a second pair of points, the second continuous conductive path spaced from the first continuous conductive path by at least a portion of the dielectric medium, wherein the first continuous conductive path is galvanically coupled to the second continuous conductive path by a via connection extending through at least a portion of the dielectric medium.

2. The filtering device of claim 1 wherein at least a portion of the conductive metal in the first dissipative layer is coupled to ground.

3. The filtering device of claim 1, further comprising a plurality of disconnected metal particles embedded in at least a portion of the dielectric medium.

4. The filtering device of claim 1, further comprising a plurality of disconnected metal particles embedded in at least a portion of an epoxy substance, wherein at least a portion of the epoxy substance is in contact with at least a portion of the dielectric medium.

5. The filtering device of claim 1 wherein the first circuitous route is a meandering signal path that connects the first pair of points on the dielectric medium by a plurality of changes in direction across a width of the dielectric medium, and wherein the first pair of points includes a first point near a first end of the dielectric medium and a second point near an opposite end of the dielectric medium along a length of the dielectric medium.

6. The filtering device of claim 1 wherein the first circuitous route is at least one of a coil signal path and a spiral signal path that connects the first pair of points on the dielectric medium by concentric turns inwards from a perimeter of the dielectric medium towards a center of the dielectric medium, and wherein the first pair of points includes a first point near the perimeter of the dielectric medium and a second point near the center of the dielectric medium.

7. The filtering device of claim 1 wherein the second continuous conductive path comprises a second conductive layer formed of a first conductive metal and a second dissipative layer formed of a second conductive metal, and wherein a resistance of the second conductive metal is higher than a resistance of the first conductive metal and the second conductive layer and the second dissipative layer are plated one on top of the other such that the second conductive layer provides a path through which an electrical signal flows and the second dissipative layer provides dissipation of unwanted signal frequencies.

8. The filtering device of claim 1 wherein the second circuitous route is a meandering signal path that connects the second pair of points by a plurality of changes in direction across a width of the dielectric medium, and wherein the second pair of points includes a first point near a first end of the dielectric medium and a second point near an opposite end of the dielectric medium along a length of the dielectric medium.

9. The filtering device of claim 1 wherein the second circuitous route is at least one of a coil signal path and a spiral signal path that connects the second pair of points by concentric turns inwards from a perimeter of the dielectric medium towards a center of the dielectric medium, and wherein the second pair of points includes a first point near the perimeter of the dielectric medium and a second point near the center of the dielectric medium.

10. The electrical signal filtering device of claim 1, further comprising:
a first shielding layer comprising an approximately uniform metal plane; and
a second shielding layer comprising an approximately uniform metal plane, wherein both the first continuous conductive path and the second continuous conductive path are situated in between the first and the second shielding layers, and wherein a number of edges of the dielectric medium are plated with shielding metal such that both the first continuous conductive path and the second continuous conductive path are at least partially enclosed by the shielding metal of the first and the second shielding layers and the plated edges.

11. The filtering device of claim 1 wherein the dielectric medium, the first continuous conductive path, and the second continuous conductive path form a printed circuit board.

12. The filtering device of claim 11 wherein the printed circuit board includes a flexible printed circuit board.

13. The filtering device of claim 1 wherein the conductive metal in the first conductive layer is formed of a material that is superconducting below a critical temperature such that the first resistance is substantially zero and the conductive metal in the first dissipative layer is formed of a material that is not superconducting below the critical temperature such that the second resistance is not zero.

14. The filtering device of claim 1 wherein the dielectric medium comprises a first surface and a second surface, and wherein the first continuous conductive path is carried on the first surface and the second continuous conductive path is carried on the second surface.

15. The filtering device of claim 1 wherein the dielectric medium comprises multiple layers, and wherein the first continuous conductive path is carried on a first layer and the second continuous conductive path is carried on a second layer.

16. The filtering device of claim 1 wherein the conductive metal in the first conductive layer is carried directly on the dielectric medium and the conductive metal in the first dissipative layer is plated upon the conductive metal in the first conductive layer.

17. The filtering device of claim 1 wherein the conductive metal in the first dissipative layer is carried directly on the dielectric medium and the conductive metal in the first conductive layer is plated on the conductive metal in the first dissipative layer.

* * * * *